United States Patent [19]
Aimoto et al.

[11] Patent Number: 5,815,442
[45] Date of Patent: Sep. 29, 1998

[54] DATA TRANSFER APPARATUS WITH LARGE NOISE MARGIN AND REDUCED POWER DISSIPATION

[75] Inventors: Yoshiharu Aimoto; Tohru Kimura; Yoshikazu Yabe, all of Tokyo, Japan

[73] Assignee: NEC Corporation, Tokyo, Japan

[21] Appl. No.: 705,340

[22] Filed: Aug. 29, 1996

[30] Foreign Application Priority Data

Aug. 31, 1995 [JP] Japan ................................. 7-248674

[51] Int. Cl.$^6$ .............................................. G11C 16/04
[52] U.S. Cl. .............. 365/189.01; 365/190; 365/189.11; 365/203; 365/206
[58] Field of Search ................. 365/189.01, 190, 365/203, 206, 189.11

[56] References Cited

U.S. PATENT DOCUMENTS 4,161,040  7/1979  Satoh ........................................ 365/203
5,233,558  8/1993  Fujii et al. ............................. 365/203 X

OTHER PUBLICATIONS

Akira Tanabe et al., "A 30-ns 64-Mb DRAM with Built-in Self-Test and Self-Repair Function", IEEE Journal of Solid-State Circuits, vol. 27, No. 11, pp.1525–1533, Nov. 1992.

Primary Examiner—David C. Nelms
Assistant Examiner—Hoai Ho
Attorney, Agent, or Firm—Ostrolenk, Faber, Gerb & Soffen, LLP

[57] ABSTRACT

In a data transfer apparatus powered by first and second power supply voltages, a data output circuit generates first complementary output signals, a data transfer circuit having a large load capacitance transfers the first complementary output signals to generate second complementary output signals, and an amplifier circuit amplifies the second complementary output signals to generate third complementary output signals. A first transfer gate circuit is connected between the data output circuit and the data transfer circuit. A second transfer gate circuit is connected between the data transfer circuit and the amplifier circuit. The first, second and third complementary output signals are caused to be approximately at an intermediate level between the first and second voltages.

19 Claims, 33 Drawing Sheets

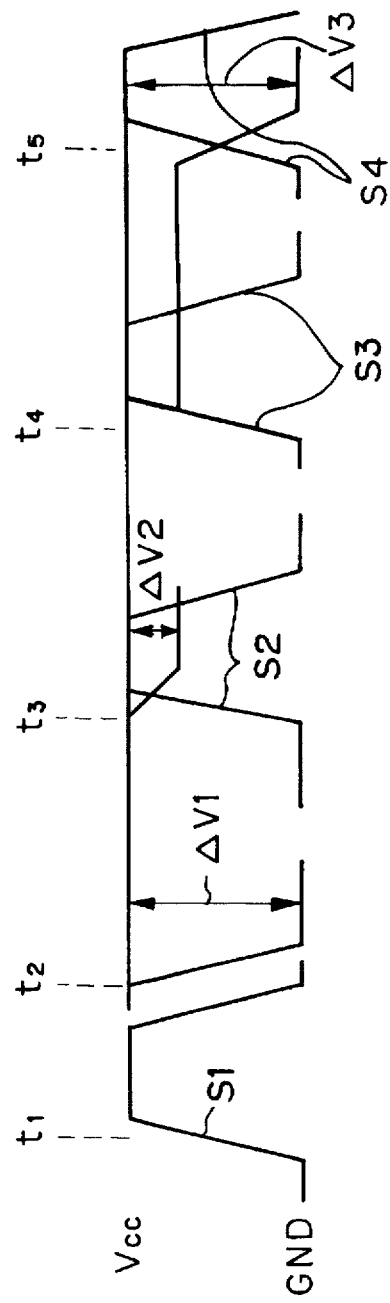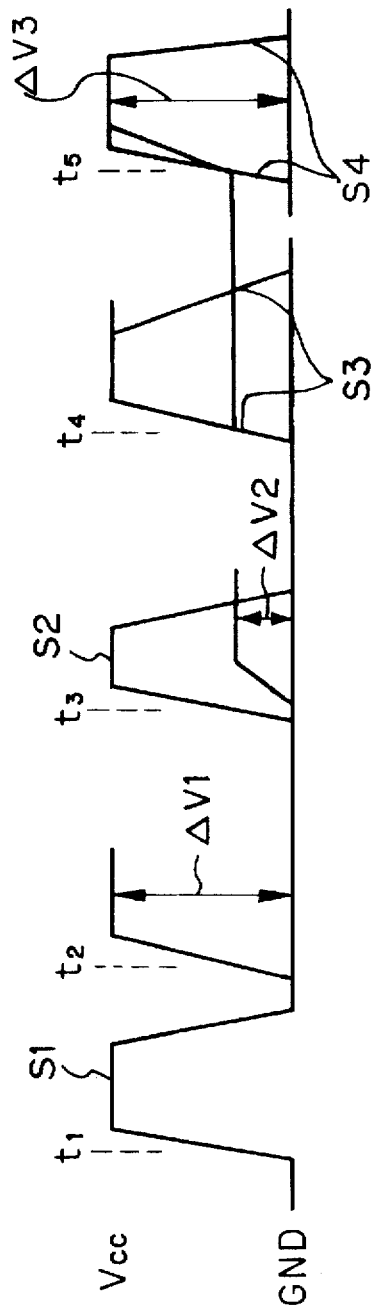

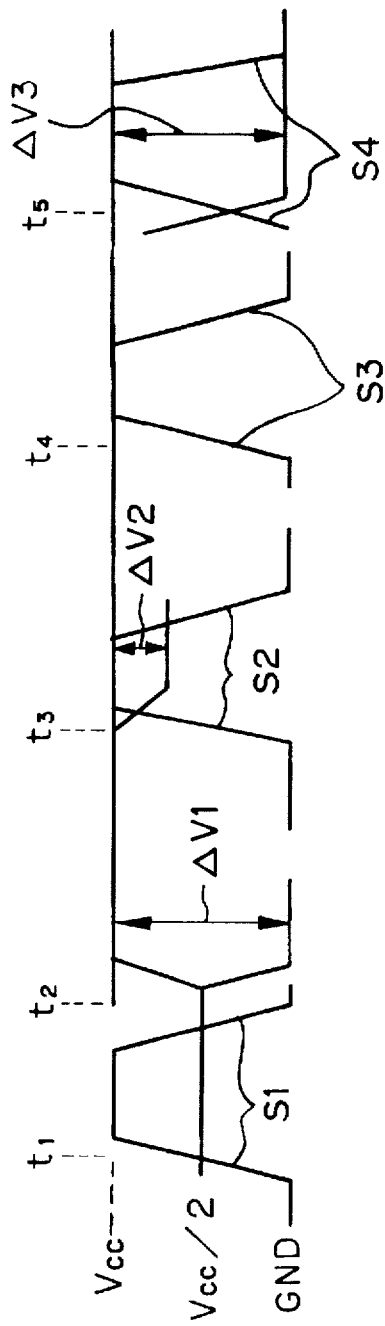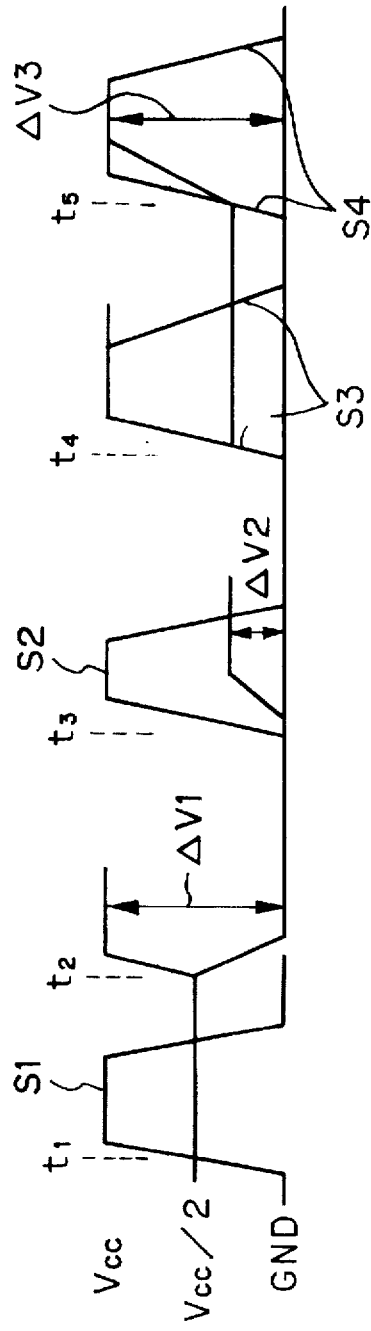

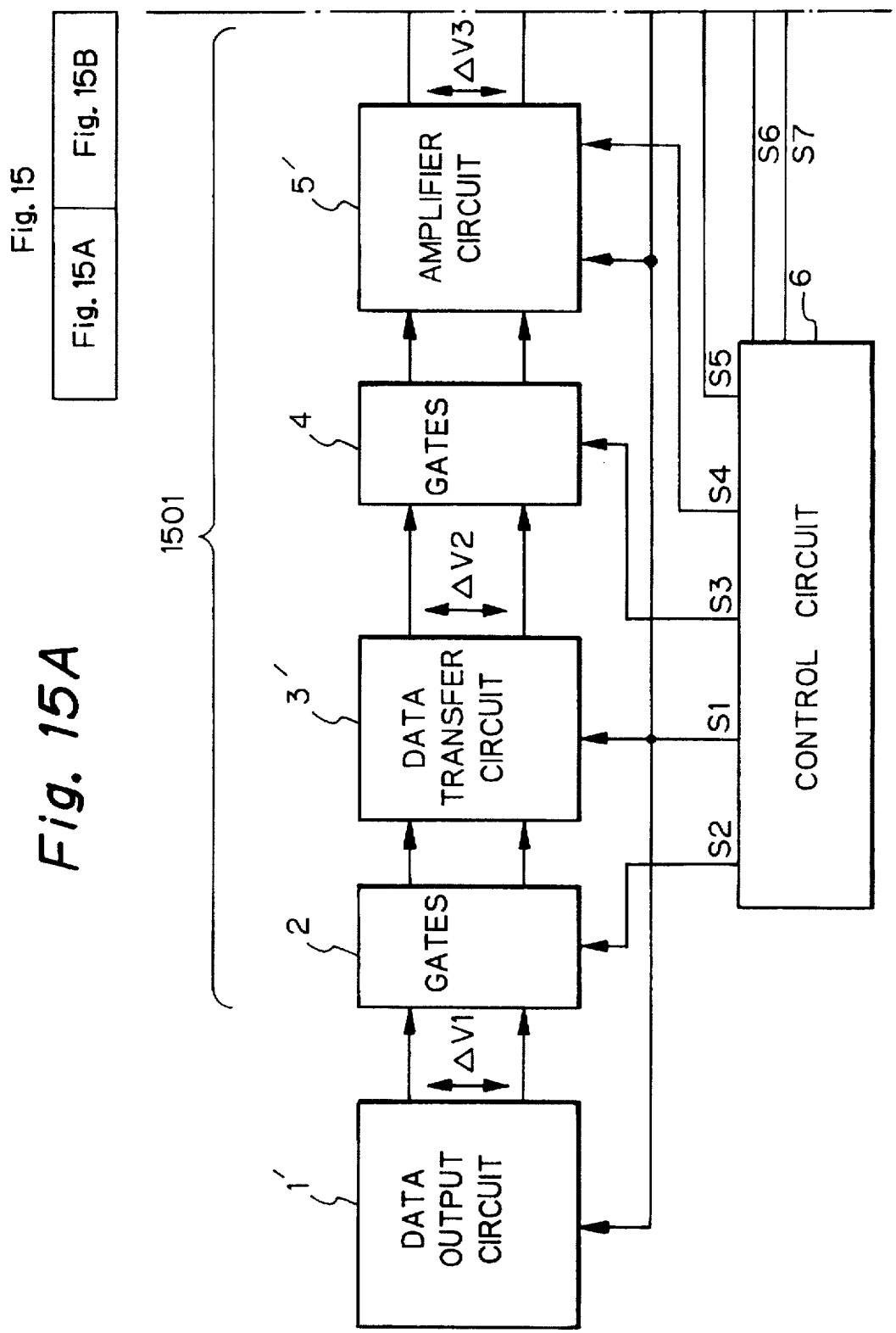

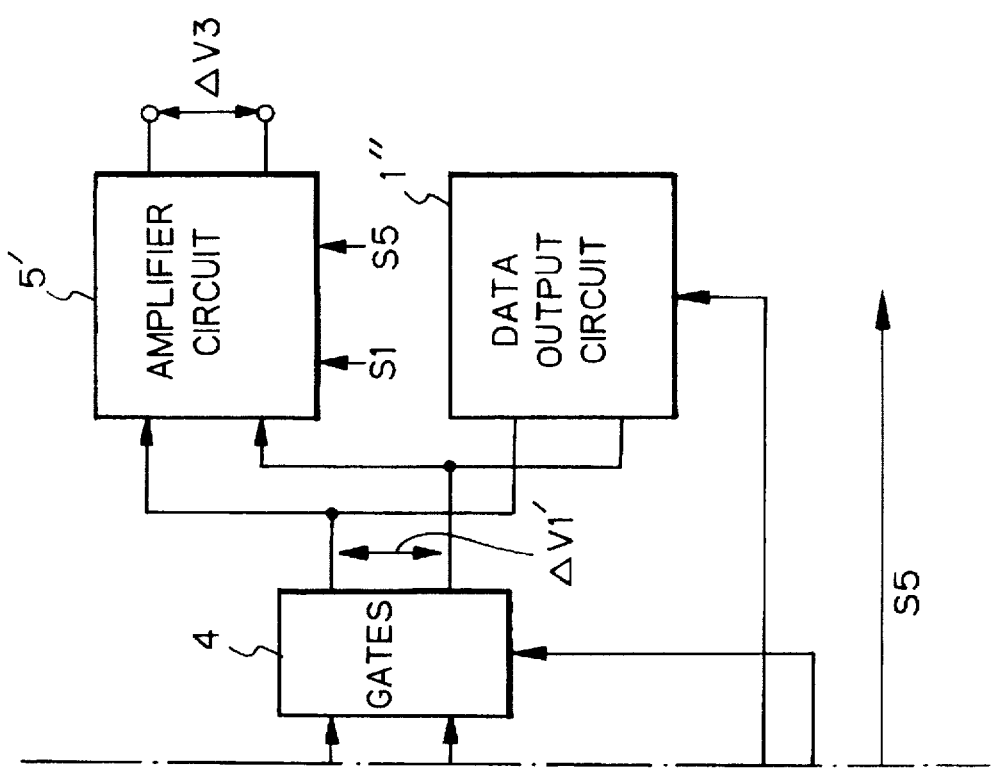

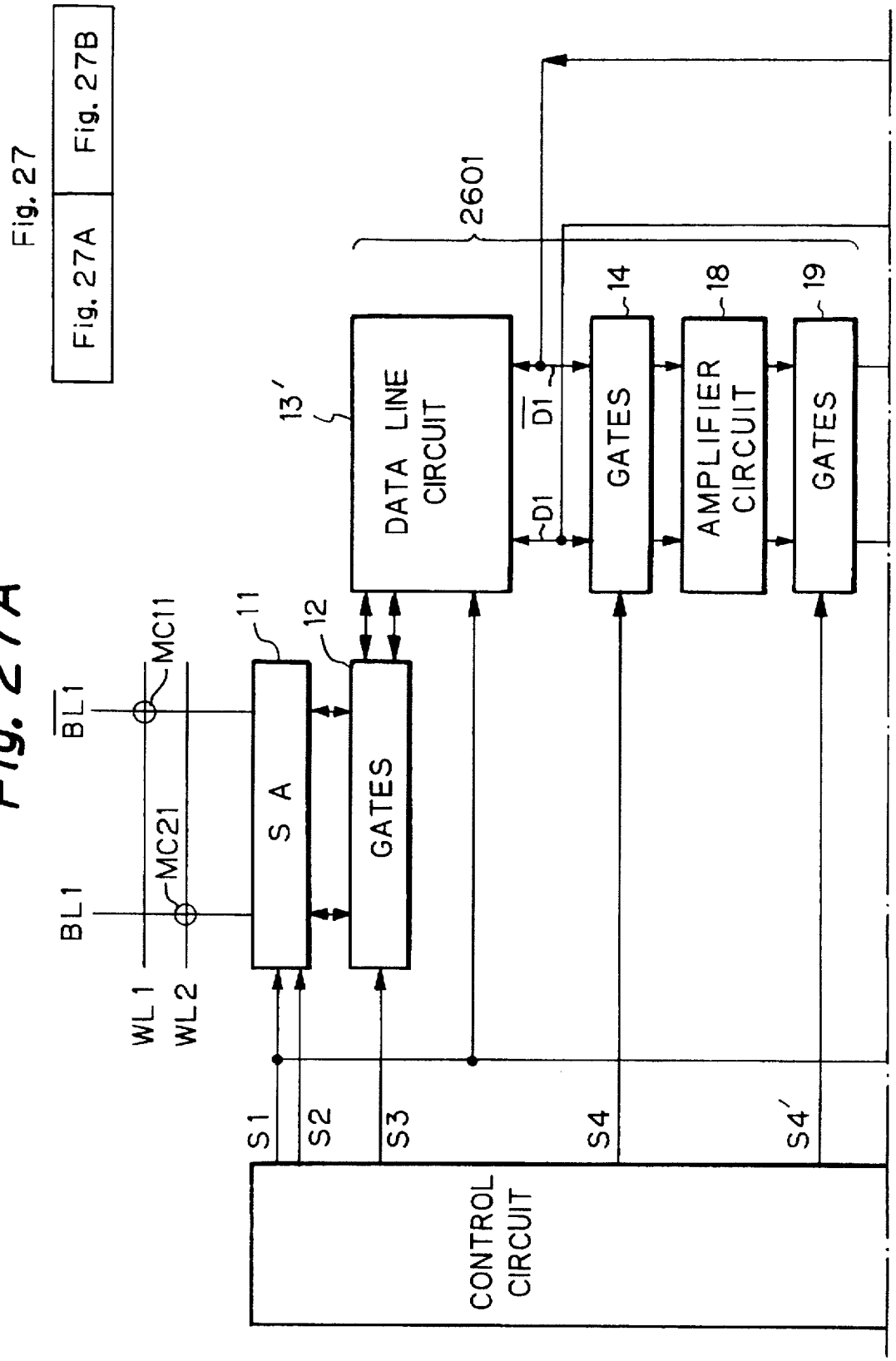

DATA TRANSFER APPARATUS WITH LARGE NOISE MARGIN AND REDUCED POWER DISSIPATION

BACKGROUND OF THE INVENTION

1. Field of the Invention

The present invention relates to a data transfer apparatus.

2. Description of the Related Art

In a prior art data transfer apparatus, a data output circuit generates first complementary output signals, a data transfer circuit having a large load capacitance transfers the first complementary output signals to generate second complementary output signals, and an amplifier circuit amplifies the second complementary output signals to generate third complementary output signals. Also, a first transfer gate circuit is connected between the data output circuit and the data transfer circuit, and a second transfer gate circuit is connected between the data transfer circuit and the amplifier circuit. During a reset time period, the first, second and third complementary output signals are caused to be either a power supply voltage $V_{CC}$ or a ground voltage GND. This will be explained later in detail.

In the above-mentioned prior art data transfer apparatus, however, since one of the output signals of the data output circuit, one of the output signals of the data transfer circuit and one of the output signals of the amplifier circuit are swung from the power supply voltage $V_{CC}$ or the ground voltage GND, they are subject to fluctuation of the power supply voltage $V_{CC}$ or the ground voltage GND, and thus, a noise margin is reduced. Also, power dissipation is increased due to a large charging or discharging amount.

SUMMARY OF THE INVENTION

It is an object of the present invention to provide a data transfer apparatus having a large noise margin and reduced power dissipation.

According to the present invention, in a data transfer apparatus powered by first and second power supply voltages, a data output circuit generates first complementary output signals, a data transfer circuit having a large load capacitance transfers the first complementary output signals to generate second complementary output signals, and an amplifier circuit amplifies the second complementary output signals to generate third complementary output signals. A first transfer gate circuit is connected between the data output circuit and the data transfer circuit. A second transfer gate circuit is connected between the data transfer circuit and the amplifier circuit. The first, second and third complementary output signals are caused to be approximately at an intermediate level $V_{CC}/2$ between the first and second voltages.

Thus, the output signals of the data output circuit, the output signals of the data transfer circuit and the output signals of the amplifier circuit are swung from the level $V_{CC}/2$, they are not subject to the fluctuation of the power supply voltages, and thus, a noise margin is increased. Also, power dissipation is decreased due to a small charging or discharging amount.

BRIEF DESCRIPTION OF THE DRAWINGS

The present invention will be more clearly understood from the description as set forth below, in comparison with the prior art, with reference to the accompanying drawings, wherein:

FIGS. 2A and 2B are timing diagrams showing the operation of the apparatus of FIG. 1;

FIGS. 4A and 4B are timing diagrams showing the operation of the apparatus of FIG. 3;

FIGS. 14, 15, 15A and 15B are block circuit diagrams of modifications of the apparatus of FIG. 12;

FIGS. 18, 18A, 18B, 19, 19A and 19B are block circuit diagrams of modifications of the apparatus of FIG. 16;

FIGS. 26, 27, 27A and 27B are block circuit diagrams of modifications of the apparatus of FIG. 22;

DESCRIPTION OF THE PREFERRED EMBODIMENTS

Before the description of the preferred embodiments, prior art data transfer apparatuses will be explained with reference to FIGS. 1, 2A, 2B, 3, 4A, 4B, 5, 6, 7, 8, 9, and 10.

Figure 1:
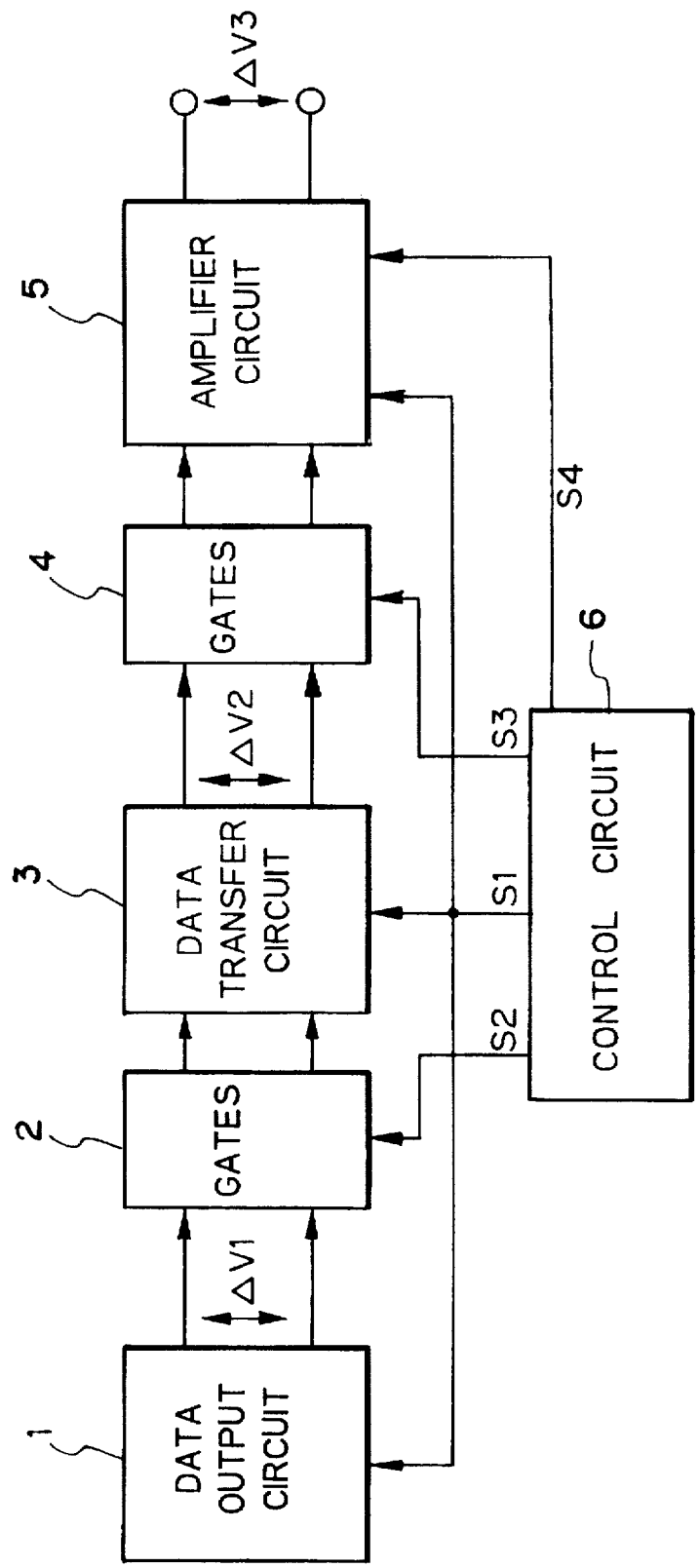
FIG. 1 is a block circuit diagram illustrating a first prior art data transfer apparatus.

In FIG. 1, which illustrates a first prior art data transfer apparatus, reference numeral 1 designates a data output circuit for generating two complementary output signals whose amplitude is ΔV1. The complementary output signals of the data output circuit 1 are transmitted via a transfer gate circuit 2 to a data transfer circuit 3 for generating two complementary output signals whose amplitude is ΔV2. Note that the data transfer circuit 3 has a large load which is comprised of long connections and the like. The complementary output signals of the data transfer circuit 3 are transmitted via a transfer gate circuit 4 to an amplifier circuit 5 for generating two complementary output signals whose amplitude is ΔV3. Also, a control circuit 6 is connected to the data output circuit 1, the transfer gate circuit 2, the data transfer circuit 3, the transfer gate circuit 4 and the amplifier circuit 5.

Each of the data output circuit 1, the data transfer circuit 3 and the amplifier circuit 5 incorporates a precharging circuit. Therefore, when the control circuit 6 generates a control signal S1 and transmits it to the data output circuit 1, the data transfer circuit 3 and the amplifier circuit 5, the output signals of the data output circuit 1, the output signals of the data transfer circuit 3 and the output signals of the amplifier circuit 5 are pulled up to a power supply voltage $V_{CC}$ or pulled down to a ground voltage GND.

The operation of the data transfer apparatus of FIG. 1 is explained with reference to FIGS. 2A and 2B.

In FIG. 2A, at time $t_1$, the control circuit 6 generates a control signal S1 to pull the output signals of the data output circuit 1, the output signals of the data transfer circuit 3 and the output signals of the amplifier circuit 5 up to the power supply voltage $V_{CC}$. Then, the control signal S1 is deactivated.

Next, at time $t_2$, the amplitude ΔV1 of the output signals of the data output circuit 1 is increased to $V_{CC}$–GND. That is, one of the output signals of the data output circuit 1 is maintained at $V_{CC}$, while the other becomes GND.

Next, at time $t_3$, the control circuit 6 generates a control signal S2 and transmits it to the transfer gate circuit 2. As a result, the transfer gate circuit 2 is opened to pass the output signals of the data output circuit 1 to the data transfer circuit 3. Therefore, the amplitude ΔV2 of the output signals of the data transfer circuit 2 is increased. That is, one of the output signals of the data transfer circuit 3 is maintained at $V_{CC}$, while the other becomes lower. In this case, $$\Delta V2 = \{C1/(C1+C2)\} V_{CC}$$

where C1 is an output load capacitance of the data output circuit 1;

C2 is an input load capacitance of the data transfer circuit 3. Generally, since C1<C2, $$\Delta V1 > \Delta V2$$

Then, the control signal S2 is deactivated.

Next, at time $t_4$, the control circuit 6 generates a control signal S3 and transmits it to the transfer gate circuit 4. As a result, the transfer gate circuit 4 is opened to pass the output signals of the data transfer circuit 3 to the amplifier circuit 5. Therefore, the amplitude ΔV3 of the output signals of the amplifier circuit 5 is increased. Then, the control signal S3 is deactivated.

Finally, at time $t_5$, the control circuit 6 generates a control signal S4 and transmits it to the amplifier circuit 5. As a result, the amplitude ΔV3 of the output signals of the amplifier circuit 5 is further increased to $V_{CC}$–GND. That is, one of the output signals of the amplifier circuit 5 is maintained at $V_{CC}$, while the other becomes GND. Then, the control signal S4 is deactivated.

In FIG. 2B, at time $t_1$, the control circuit 6 generates a control signal S1 to pull the output signals of the data output circuit 1, the output signals of the data transfer circuit 3 and the output signals of the amplifier circuit 5 down to the ground voltage GND.

Next, at time $t_2$, the amplitude ΔV1 of the output signals of the data output circuit 1 is increased to $V_{CC}$–GND. That is, one of the output signals of the data output circuit 1 is maintained at GND, while the other becomes $V_{CC}$.

Next, at time $t_3$, the control circuit 6 generates a control signal S2 and transmits it to the transfer gate circuit 2. As a result, the transfer gate circuit 2 is opened to pass the output signals of the data output circuit 1 to the data transfer circuit 3. Therefore, the amplitude ΔV2 of the output signals of the data transfer circuit 2 is increased. That is, one of the output signals of the data transfer circuit 3 is maintained at GND, while the other becomes higher. Also, in this case, $$\Delta V2 = \{C1/(C1+C2)\} V_{CC}$$

Generally, since C1<C2, ΔV1>ΔV2
Then, the control signal S2 is deactivated.

Finally, at time $t_4$, the control circuit 6 generates a control signal S3 and transmits it to the transfer gate circuit 4. As a result, the transfer gate circuit 4 is opened to pass the output signals of the data transfer circuit 3 to the amplifier circuit 5. Therefore, the amplitude ΔV3 of the output signals of the amplifier circuit 5 is increased. Then, the control signal S3 is deactivated.

Finally, at time $t_5$, the control circuit 6 generates a control signal S4 and transmits it to the amplifier circuit 5. As a result, the amplitude ΔV3 of the output signals of the amplifier circuit 5 is increased to $V_{CC}$–GND. That is, one of the output signals of the amplifier circuit 5 is maintained at $V_{CC}$, while the other becomes GND. Then, the control signal S3 is deactivated.

In the data transfer apparatus of FIG. 1, however, since one of the output signals of the data output circuit 1, one of the output signals of the data transfer circuit 3 and one of the output signals of the amplifier circuit 5 are swung from the power supply voltage $V_{CC}$ or the ground voltage GND, they are subject to fluctuation of the power supply voltage $V_{CC}$ or the ground voltage GND, and thus, a noise margin is reduced. Also, power dissipation is increased due to a large charging or discharging amount.

Figure 3:
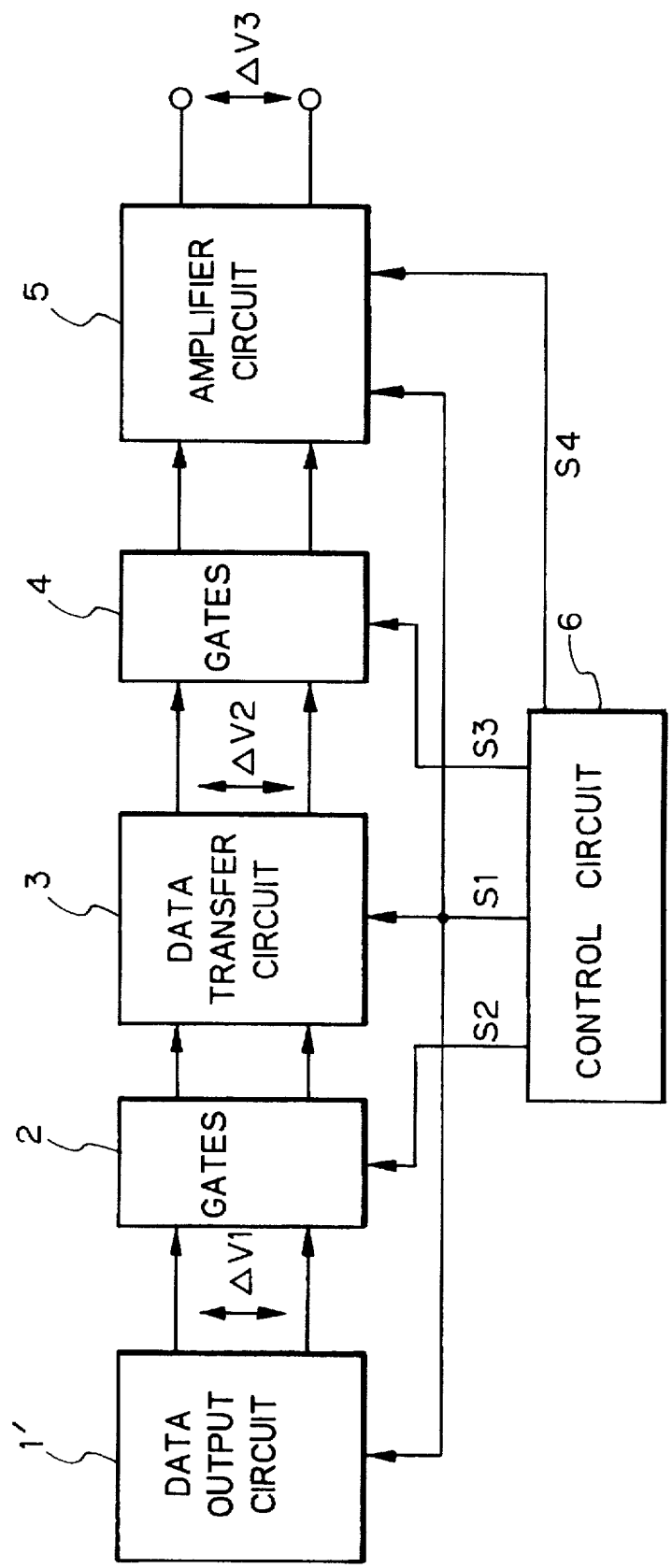
FIG. 3 is a block circuit diagram illustrating a second prior art data transfer apparatus.

In FIG. 3, which illustrates a second prior art data transfer apparatus, a data output circuit 1' is provided instead of the data output circuit 1 of FIG. 1. The data output circuit 1' incorporates a $V_{CC}/2$ precharging circuit. As a result, as shown in FIGS. 4A and 4B, which correspond to FIGS. 2A and 2B, when the control circuit 6 generates a control signal S1 and transmits it to the data output circuit 1', the output signals of the data output circuit 1 are caused to be $V_{CC}/2$. On the other hand, the output signals of the data transfer circuit 3 and the output signals of the amplifier circuit 5 are pulled up to $V_{CC}$ (see FIG. 4A) or down to GND (see FIG. 4B)

Even in the data transfer apparatus of FIG. 3, however, since one of the output signals of the data transfer circuit 3 and one of the output signals of the amplifier circuit 5 are swung from the power supply voltage $V_{CC}$ or the ground voltage GND, they are subject to fluctuation of the power supply voltage $V_{CC}$ or the ground voltage GND, and thus, a noise margin is reduced. Also, power dissipation is increased due to a large charging or discharging amount.

Figure 5:
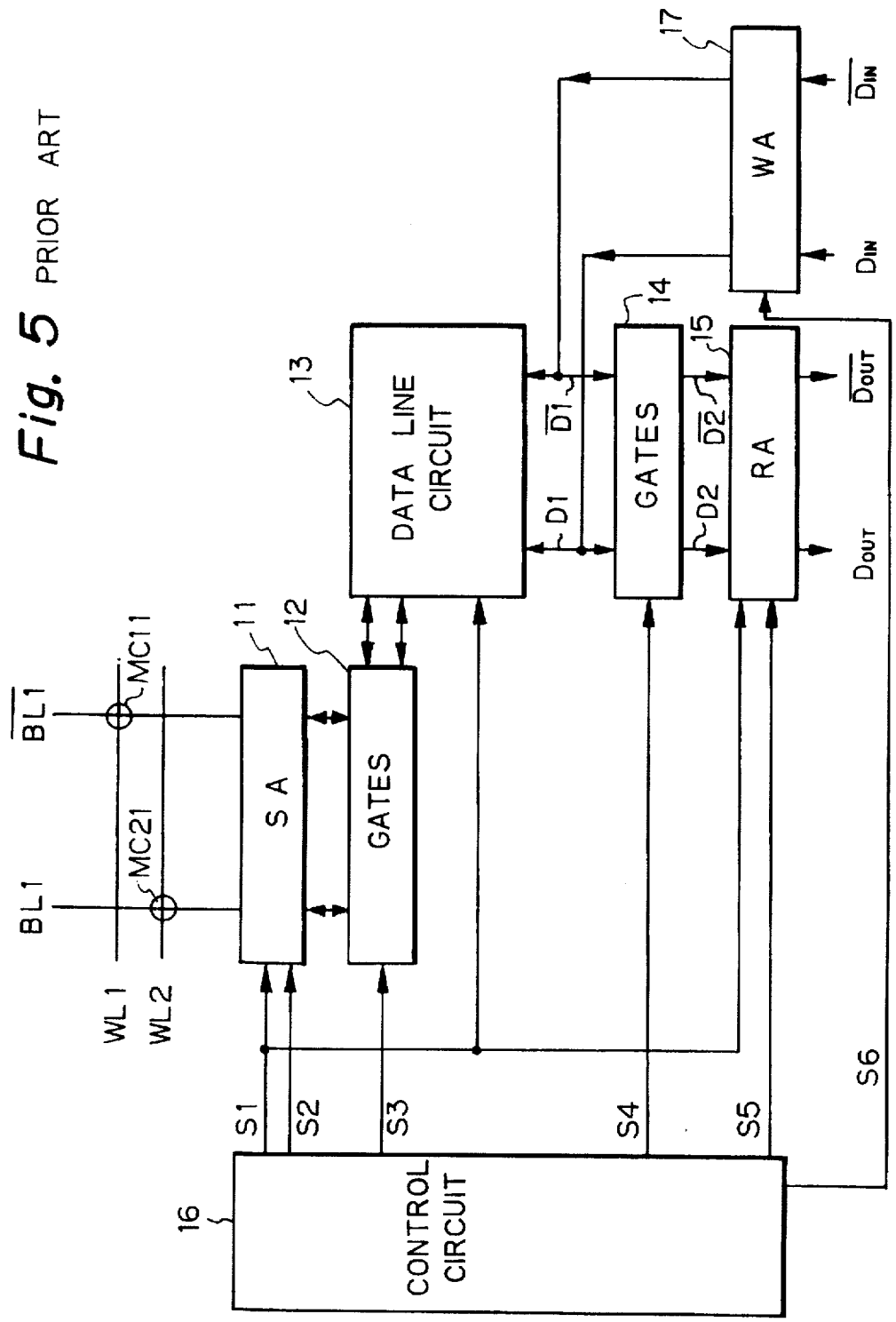
FIG. 5 is a block circuit diagram illustrating a third prior art data transfer apparatus.

In FIG. 5, which illustrates a third prior art data transfer apparatus, the second prior art data transfer apparatus of FIG. 3 is applied to a dynamic random access memory (DRAM) device. That is, memory cells MC11, MC12, . . . are provided at intersections between word lines WL1, WL2, . . . and bit lines BL1, $\overline{BL1}$, . . . A sense amplifier 11 senses a small difference in potential between the bit lines BL1 and $\overline{BL1}$ and corresponds to the data output circuit 1' of FIG. 3. That is, the sense amplifier 11 incorporates a $V_{CC}/2$ charging circuit. Also, a transfer gate circuit 12, a data line circuit 13 formed by data lines D1 and $\overline{D1}$ having a large load capacitance, a transfer gate 14, a read amplifier 15 and a control circuit 16 correspond to the transfer gate circuit 2, the data transfer circuit 3, the transfer gate circuit 4, the amplifier circuit 5 and the control circuit 6, respectively, of FIG. 3. That is, the data line circuit 13 and the read amplifier 15 incorporate $V_{CC}$ precharging circuits.

Further, a write amplifier 17 is connected to the data lines 13.

Each of the portions of the apparatus of FIG. 5 is explained next.

Figure 6:
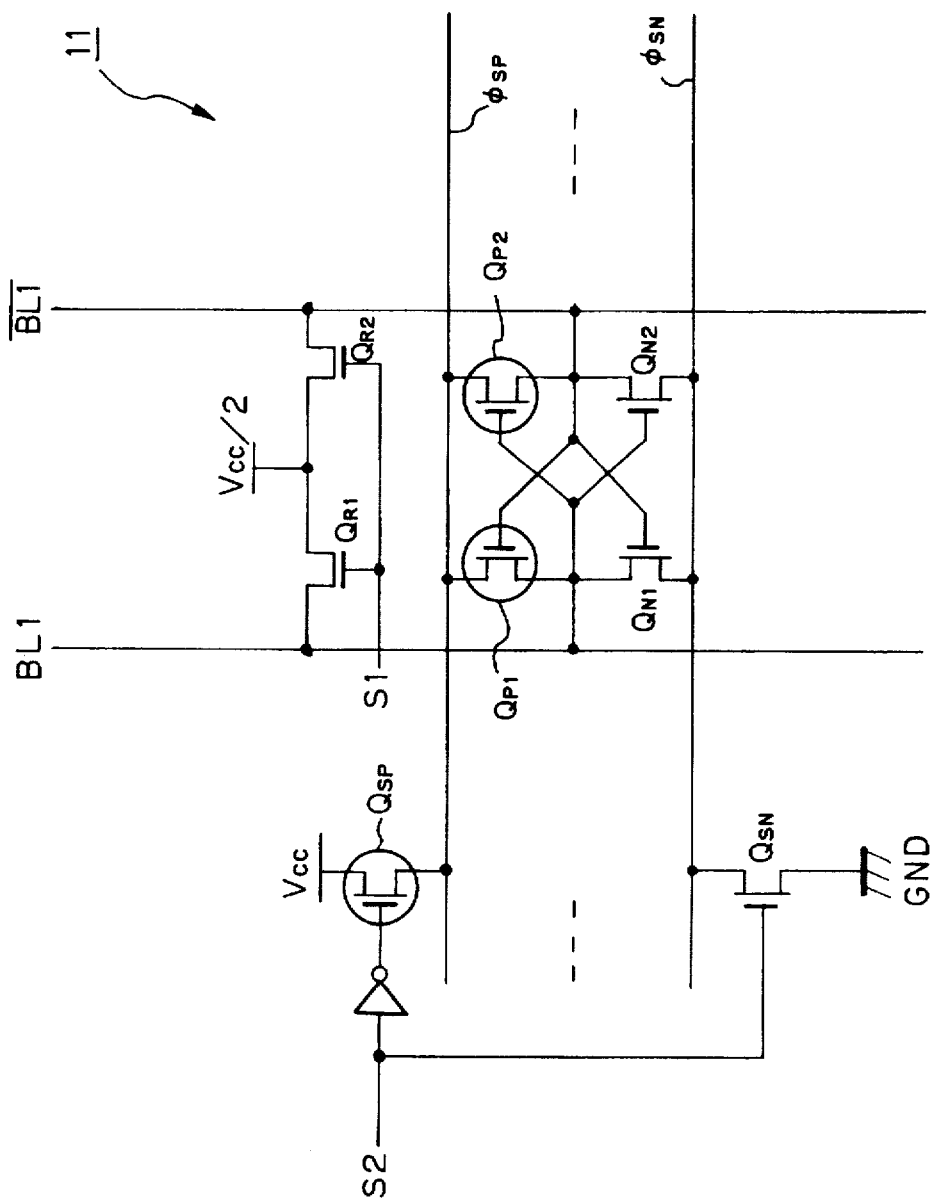
FIG. 6 is a detailed circuit diagram of the sense amplifier of FIG. 5.

In FIG. 6, which is a detailed circuit diagram of the sense amplifier 11 of FIG. 5, the sense amplifier 11 is constructed by resetting or precharching transistors $Q_{R^1}$ and $Q_{R^2}$ connected to the bit lines BL1 and $\overline{BL1}$. That is, when a control signal S1 from the control circuit 16 is made high, the voltages at the bit lines BL1 and $\overline{BL1}$ are caused to be $V_{CC}/2$. Also, the sense amplifier 11 is constructed by a flip-flop formed by P-channel MOS transistors $Q_{P^1}$ and $Q_{P^2}$ connected to a driving line $\phi_{SP}$ and N-channel MOS transistors $Q_{N^1}$ and $Q_{N^2}$ connected to a driving line $\phi_{SN}$. When a P-channel MOS transistor $Q_{SP}$ is turned ON by a control signal S2 from the control circuit 16, the driving line $\phi_{SP}$ is made $V_{CC}$. On the other hand, when an N-channel MOS transistor $Q_{SN}$ is turned ON by the control signal S2, the driving line $\phi_{SN}$ is made GND.

Figure 7:
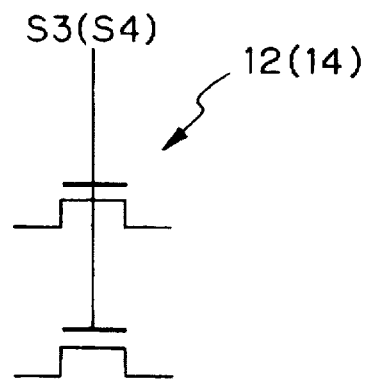
FIG. 7 is a detailed circuit diagram of the transfer gate circuit of FIG. 5.

In FIG. 7, which is a detailed circuit diagram of the transfer gate circuit 12 (14) of FIG. 5, the transfer gate circuit 12(14) is formed by two N-channel MOS transistors controlled by a control signal S3(S4) from the control circuit 16.

Figure 8:
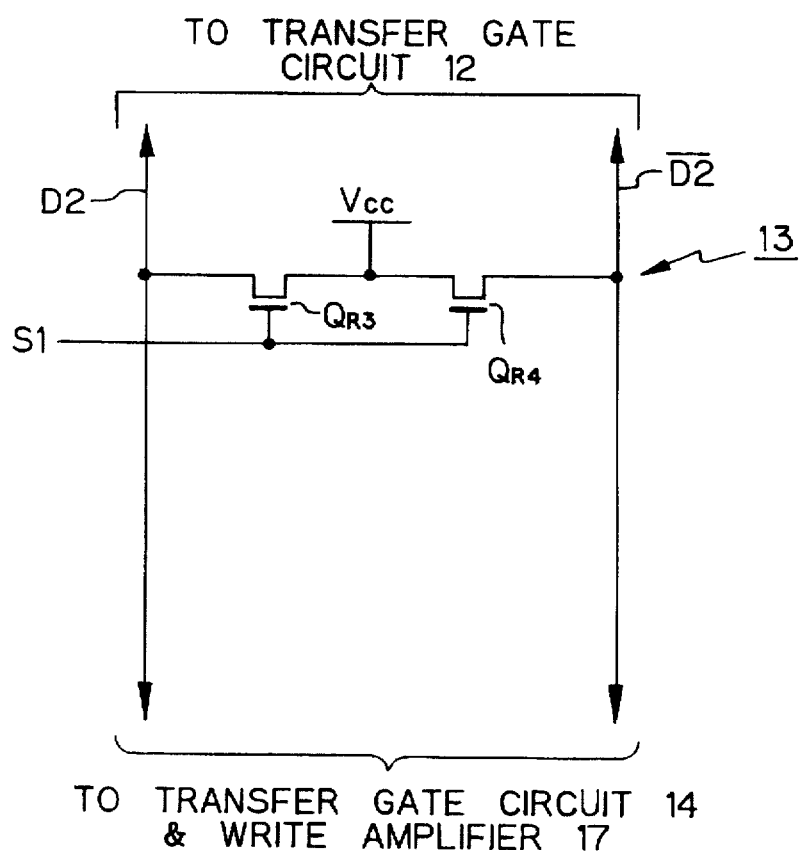
FIG. 8 is a detailed circuit diagram of the data line circuit of FIG. 5.

In FIG. 8, which is a detailed circuit diagram of the data line circuit 13 of FIG. 5, the data line circut 13 is constructed by resetting or precharging transistors $Q_{R^3}$ and $Q_{R^4}$ connected to the data lines D2 and $\overline{D2}$, respectively. That is, when the control signal S1 from the control circuit 16 is made high, the voltages at the data lines D1 and $\overline{D1}$ are caused to be $V_{CC}$.

Figure 9:
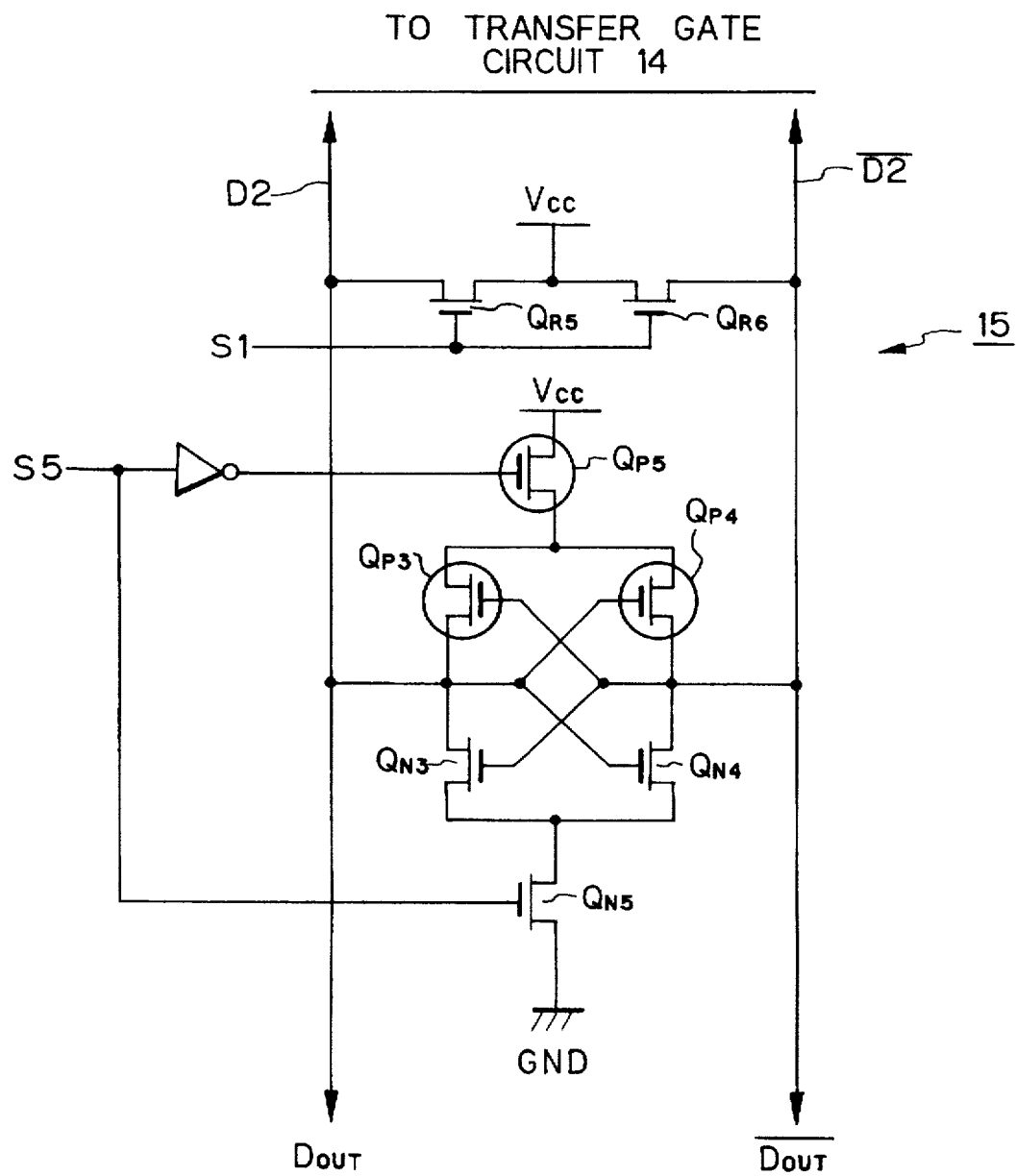
FIG. 9 is a detailed circuit diagram of the read amplifier of FIG. 5.

In FIG. 9, which is a detailed circuit diagram of the read amplifier 15 of FIG. 5, the read amplifier 15 is constructed by resetting or precharging transistors $Q_{R^3}$ and $Q_{R^4}$ connected to data lines D2 and $\overline{D2}$ of the transfer gate circuit 14. That is, when the control signal S1 from the control circuit 16 is made high, the voltages at the data lines D2 and $\overline{D2}$ are caused to be $V_{CC}$. Also, the read amplifier 15 has a similar configuration to the sense amplifier 11. That is, the read amplifier 11 is constructed by P-channel MOS transistors $Q_{P^3}$, $Q_{P^4}$ and $Q_{P^5}$ corresponding to the transistors $Q_{P^1}$, $Q_{P^2}$ and $Q_{SP}$, respectively, of FIG. 6 and N-channel transistors $Q_{N^3}$, $Q_{N^4}$ and $Q_{N^5}$ corresponding to the transistors $Q_{N^1}$, $Q_{N^2}$ and $Q_{SN}$, respectively, of FIG. 6. Thus, the read amplifier 15 is controlled by a control signal S5 from the control circuit 16 to amplify the difference in potential between the data lines D2 and $\overline{D2}$.

Figure 10:
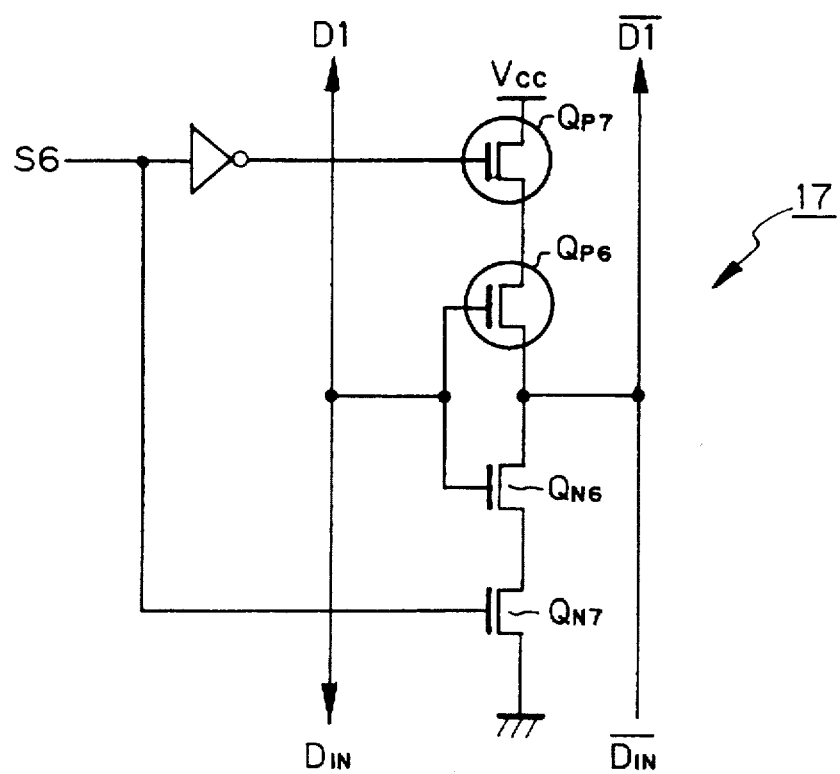
FIG. 10 is a detailed circuit diagram of the write amplifier of FIG. 5.

In FIG. 10, which is a detailed circuit diagram of the write amplifier 17 of FIG. 5, the write amplifier 17 is constructed by an inverter formed by P-channel transistors $Q_{P^6}$ and $Q_{P^7}$ and N-channel transistors $Q_{N^6}$ and $Q_{N^7}$. The transistors $Q_{P^7}$ and $Q_{N^7}$ are controlled by a control signal S6 generated from the control circuit 16. Thus, the write amplifier 17 forcibly changes voltages at the data lines D1 and $\overline{D1}$ in accordance with input data signals $D_{IN}$ and $\overline{D_{IN}}$.

Figure 11A:
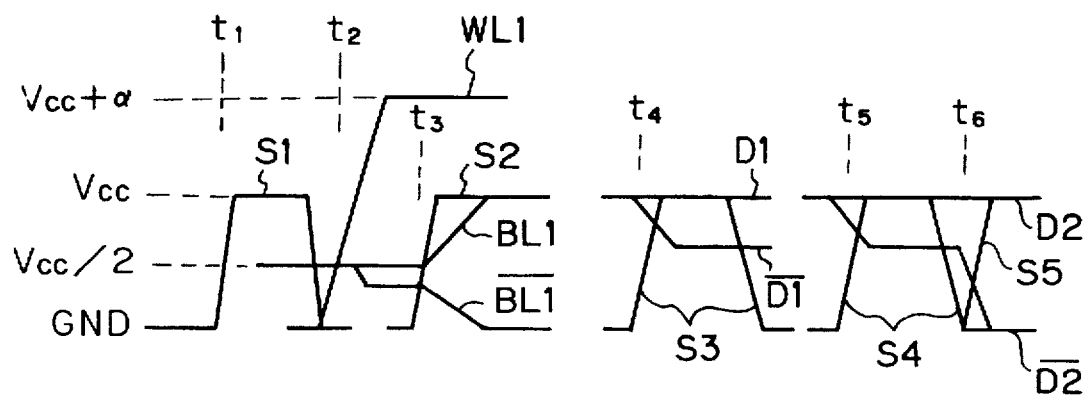
FIGS. 11A and 11B are timing diagrams showing the operation of the apparatus of FIG. 5.

A read operation of the data transfer apparatus of FIG. 5 is explained next with reference to FIG. 11A.

First, at time $t_1$, the control circuit 16 generates a control signal S1 and transmits it to the sense amplifier 11, the data line circuit 13 and the amplifier circuit 15. As a result, the voltages of the bit lines BL1 and $\overline{BL1}$ are caused to be $V_{CC}/2$, and the voltages of the data lines D1 and $\overline{D1}$ and the voltages of the data lines D2 and $\overline{D2}$ are caused to be $V_{CC}$. Then, the control signal S1 is deactivated.

Next, at time $t_2$, one word line such as WL1 is selected and its voltage is caused to be $V_{CC}+\alpha$, where $\alpha$ is sufficiently larger than a threshold voltage of the memory cells. As a result, a small difference is generated in potential between the bit lines BL1 and $\overline{BL1}$.

Next, at time $t_3$, the control circuit 16 generates a control signal S2 and transmits it to the sense amplifier 11, so that the sense amplifier 12 is activated. As a result, the voltage of one of the bit lines such as BL1 is caused to be $V_{CC}$, which the voltage of the other bit line $\overline{BL1}$ is caused to be GND.

Next, at time $t_4$, the control circuit 16 generates a control signal S3 and transmits it to the transfer gate circuit 12. As a result, the transfer gate circuit 12 is opened to pass the output signals of the sense amplifier 11 to the data line circuit 13. Therefore, the amplitude of the voltages of the data lines D1 and $\overline{D1}$ is increased. Then, the control signal S3 is deactivated. That is, the voltage of one of the data lines such as D1 is maintained at $V_{CC}$, while the voltage of the other of the data lines such as $\overline{D1}$ is made lower.

Next, at time $t_5$, the control circuit 16 generates a control signal S4 and transmits it to the transfer gate circuit 14. As a result, the transfer gate circuit 14 is opened, so that the voltages of the data lines D2 and $\overline{D2}$ are caused to be the same as those of the data lines D1 and $\overline{D1}$, respectively. Then, the control signal S4 is deactivated.

Finally, at time $t_6$, the control circuit 16 generates a control signal S5 and transmits it to the read amplifier 15, so that the read amplifier 15 is activated. As a result, the voltage of one of the data lines such as D2 is maintained at $V_{CC}$, while the voltage of the other of the data lines such as $\overline{D2}$ is caused to be GND.

Figure 11B:
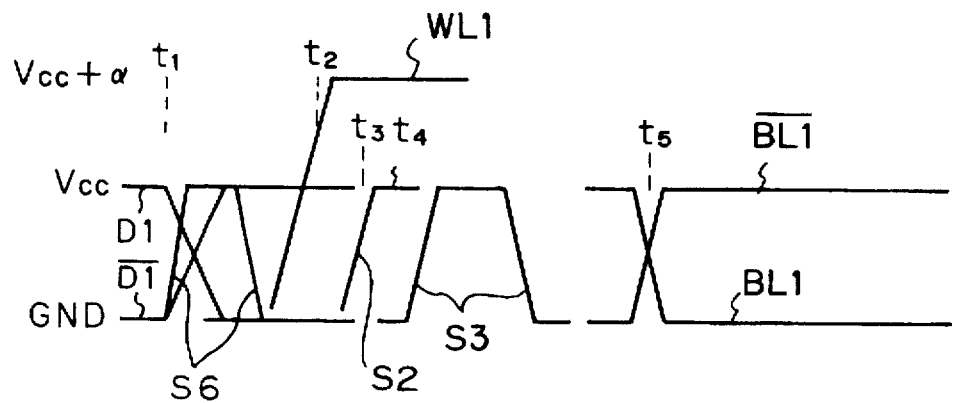

A write operation of the data transfer apparatus of FIG. 5 is explained with reference to FIG. 11B.

First, at time ti, the control circuit 16 generates a control signal S6 and transmits it to the write amplifier 17. As a result, the write amplifier 17 forcibly changes the voltages of the data lines D1 and $\overline{D1}$ in accordance with input data $D_{IN}$ and $D_{IN}$. Then, the control signal S6 is deactivated. Next, at time $t_2$, one of the word lines such as WL1 is selected and its voltage is caused to be $V_{CC}+\alpha$. Also, at time $t_3$, the control circuit 16 generates a control signal S2 and transmits it to the sense amplifier 11, so that the sense amplifier 11 is activated.

Next, at time $t_4$, the control circuit 16 generates a control signal S3 and transmits it to the transfer gate circuit 12. As a result, the transfer gate circuit 12 is opened. Then, the control signal S3 is deactivated.

When the transfer gate circuit 12 is opened, the voltages of the data lines D1 and $\overline{D1}$ determined by the write amplifier 17 forcibly change the voltages of the bit lines BL1 and $\overline{BL1}$ at time $t_5$. Thus, the content of the selected memory cell is reversed.

Even in the data transfer apparatus of FIG. 5, however, since one of the data lines D1 and $\overline{D1}$ and one of the data lines D2 and $\overline{D2}$ are swung from the power supply voltage $V_{CC}$, they are subject to fluctuation of the power supply voltage $V_{CC}$, and thus, a noise margin is reduced. Also, power dissipation is increased due to a large discharging amount.

Figure 12:
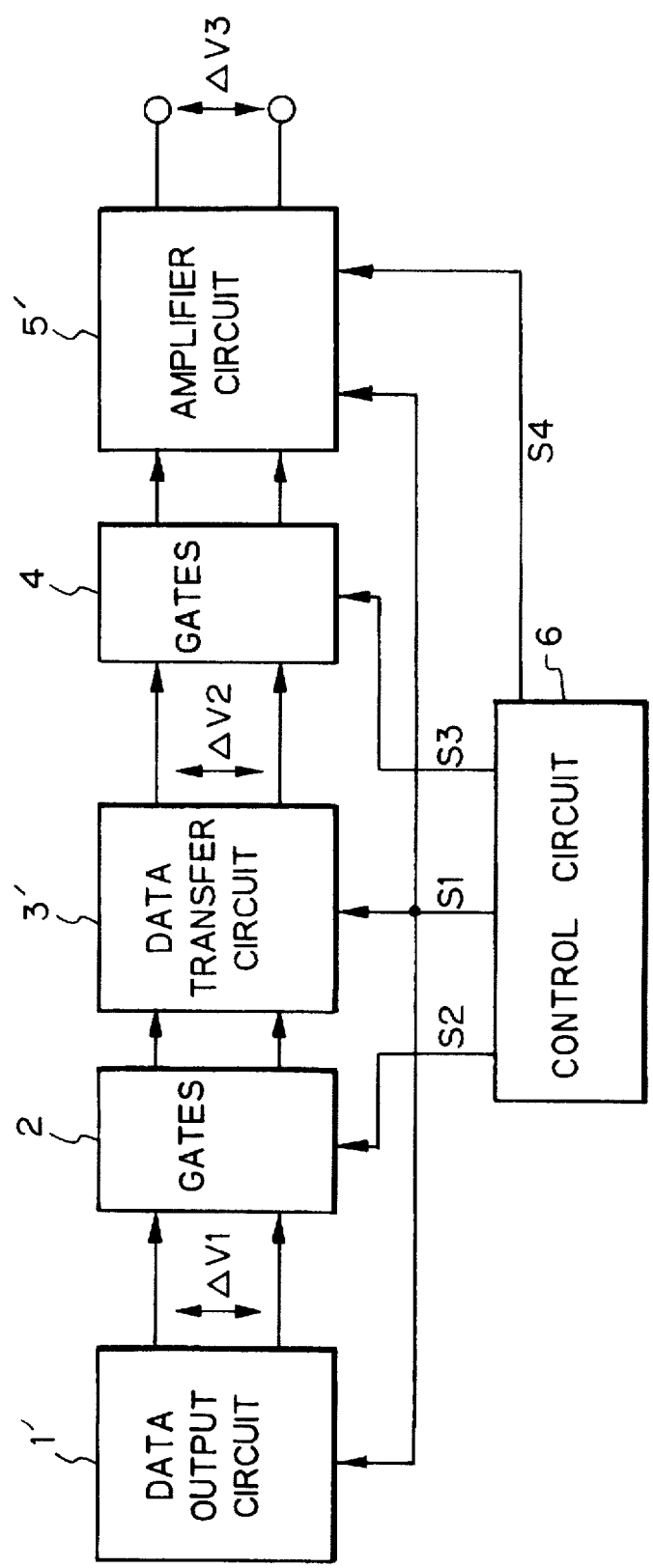
FIG. 12 is a block circuit diagram illustrating a first embodiment of the data transfer apparatus according to the present invention.

In FIG. 12, which illustrates a first embodiment of the present invention, a data transfer circuit 3' and an amplifier circuit 5' are provided instead of the data transfer circuit 3 and the amplifier circuit 5 of FIG. 3. Each of the data transfer circuit 3' and the amplifier circuit 5' incorporates a $V_{CC}/2$ precharging circuit.

The operation of the data transfer apparatus of FIG. 12 is explained next with reference to FIG. 13.

First, at time $t_1$, the control circuit 6 generates a control signal S1 and transmits it to the data output circuit 1', the data transfer circuit 3' and the amplifier circuit 5'. As a result, the output signals of the data output circuit 1', the output signals of the data transfer circuit 3' and the output signals of the amplifier circuit 5' are caused to be $V_{CC}/2$. Then, the control signal S1 is deactivated.

Next, at time $t_2$, the amplitude $\Delta V1$ of the output signals of the data output circuit 1 is increased to $V_{CC}$–GND. That is, one of the output signals of the data output circuit 1 becomes $V_{CC}$, while the other becomes GND.

Next, at time $t_3$, the control circuit 6 generates a control signal S2 and transmits it to the transfer gate circuit 2. As a result, the transfer gate circuit 2 is opened to pass the output signals of the data output circuit 1 to the data transfer circuit 3. Therefore, the amplitude $\Delta V2$ of the output signals of the data transfer circuit 2 is increased. That is, one of the output signals of the data transfer circuit 3 becomes higher, while the other becomes lower. Also, in this case, $$\Delta V2 = \{C1/(C1+C2)\} V_{CC}$$

Generally, since C1<C2, $\Delta V1$>$\Delta V2$

Then, the control signal S2 is deactivated.

Finally, at time $t_4$, the control circuit 6 generates a control signal S3 and transmits it to the transfer gate circuit 4. As a result, the transfer gate circuit 4 is opened to pass the output signals of the data transfer circuit 3 to the amplifier circuit 5. Therefore, the amplitude $\Delta V3$ of the output signals of the amplifier circuit 5 is increased to $V_{CC}$–GND. That is, one of the output signals of the amplifier circuit 5 becomes $V_{CC}$, while the other becomes GND. Then, the control signal S3 is deactivated.

In the data transfer apparatus of FIG. 12, since the output signals of the data output circuit 1', the output signals of the data transfer circuit 3' and the output signals of the amplifier circuit 5' are swung from the voltage $V_{CC}/2$, they are not subject to fluctuation of the power supply voltage $V_{CC}$ or the ground voltage GND, and thus, a noise margin is increased. Also, power dissipation is decreased due to a small charging or discharging amount.

Figure 14:
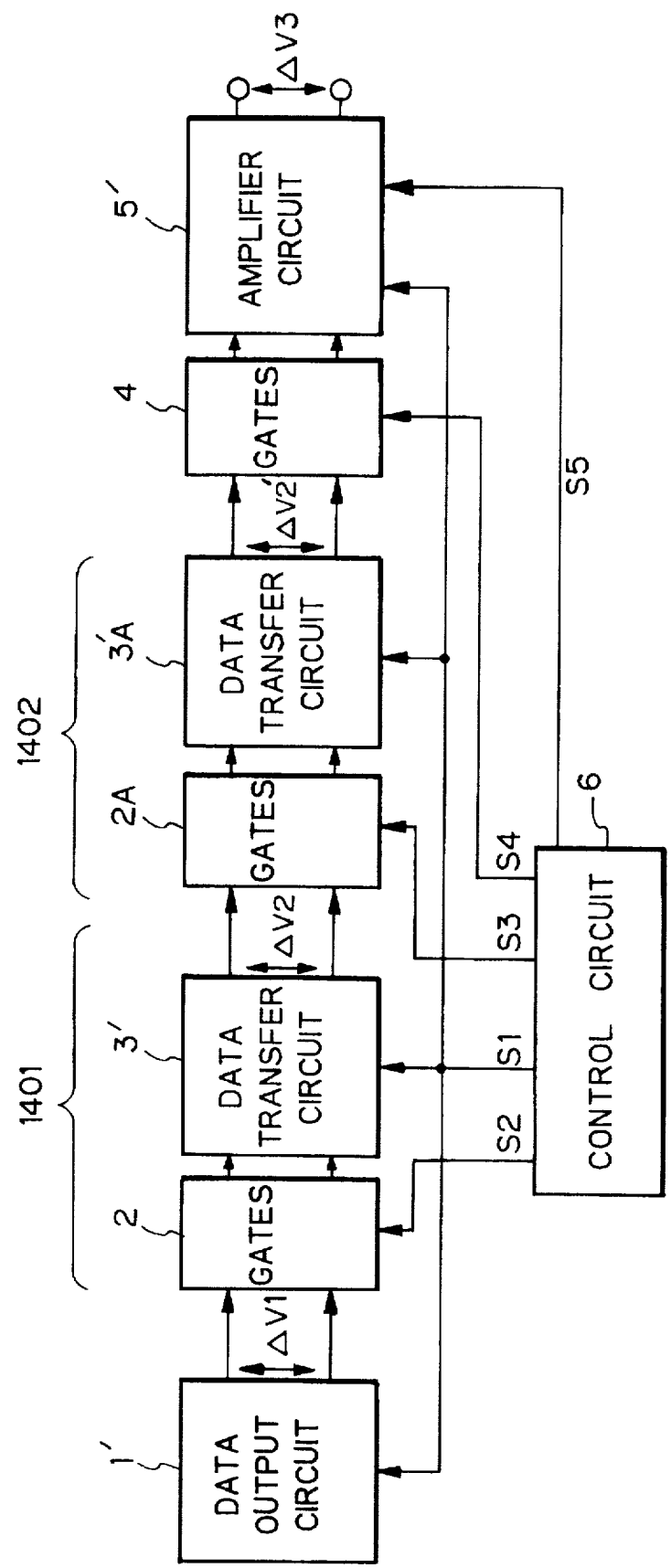

In FIG. 14, which illustrates a modification of the data transfer apparatus of FIG. 12, a transfer gate circuit 2A and a data transfer circuit 3'A indicated by 1402 having the same configuration as the transfer gate circuit 2 and the data transfer circuit 3' of FIG. 12 indicated by 1401 are added to the elements of FIG. 12. In this case, $$\Delta V2 > \Delta V2'$$

Also, three or more of series each comprising a transfer gate circuit and a data transfer circuit can be connected between the data transfer circuit 3' and the transfer gate circuit 4 of FIG. 12.

Figure 15B:
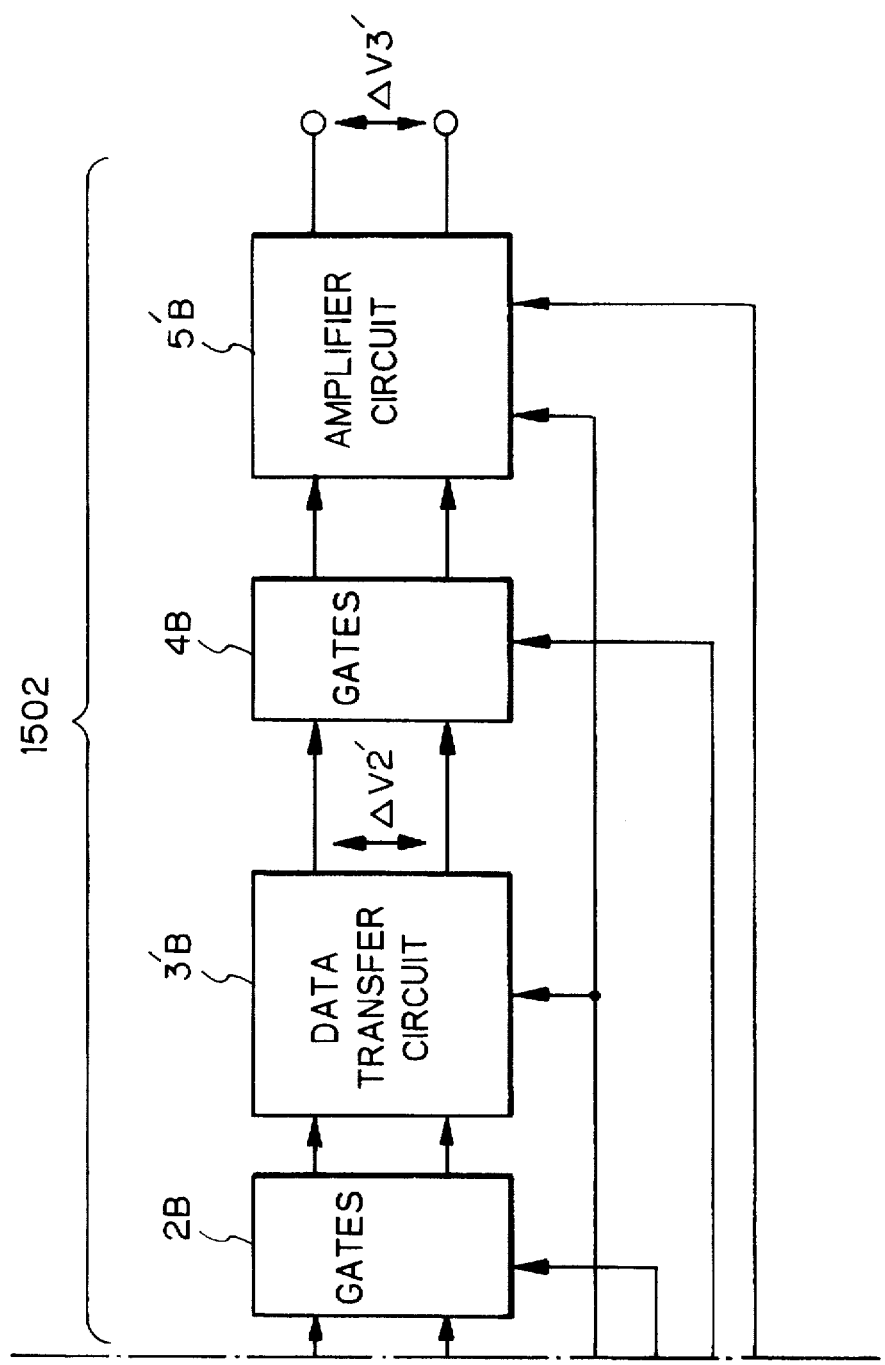

In FIGS. 15A and 15B, which illustrate another modification of the data transfer apparatus of FIG. 12, a transfer gate circuit 2B, a data transfer circuit 3'B, a transfer gate circuit 4B and an amplifier circuit 5'B indicated by 1502 having the same configuration as the transfer gate circuit 2, the data transfer circuit 3', the transfer gate circuit 4 and the amplifier circuit 5' of FIG. 12 indicated by 1501 are added to the elements of FIG. 12.

Also, three or more of series each comprising a transfer gate circuit, a data transfer circuit, a transfer gate circuit and an amplifier circuit can be connected at a post stage of the amplifier circuit 5' of FIG. 12.

Figure 16:
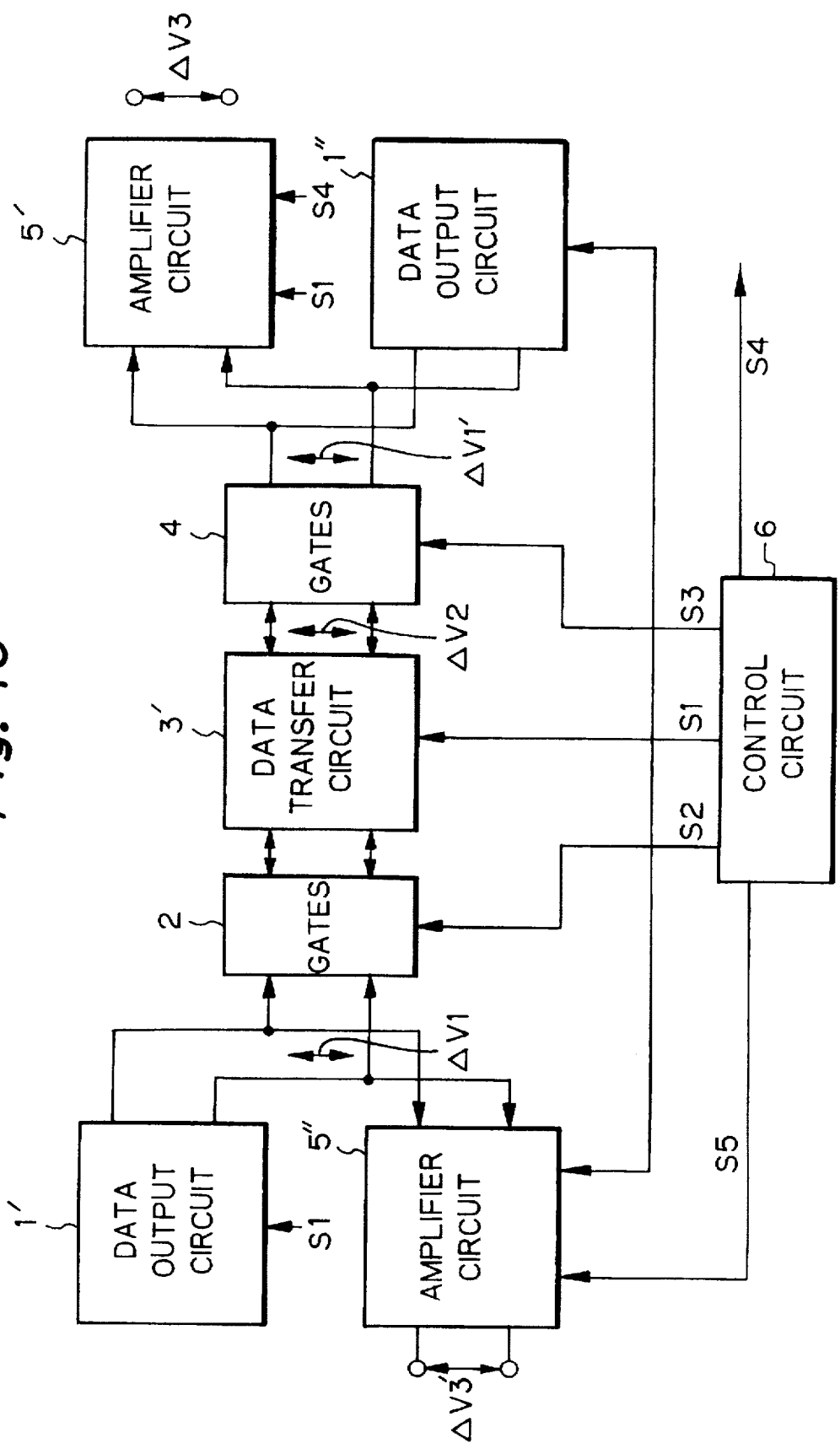
FIG. 16 is a block circuit diagram illustrating a second embodiment of the data transfer apparatus according to the present invention.

In FIG. 16, which illustrates a second embodiment of the present invention, a data output circuit 1" having the same configuration as the data output circuit 1' of FIG. 12 and an amplifier circuit 5" having the same configuration as the amplifier circuit 5' are added to the elements of FIG. 12, which realizes a bidirectional data transfer. That is, an input/output circuit is formed by the data output circuit 1' and the amplifier circuit 5". Another input/output circuit is formed by the data output circuit 1" and the amplifier circuit 5'.

Figure 13:
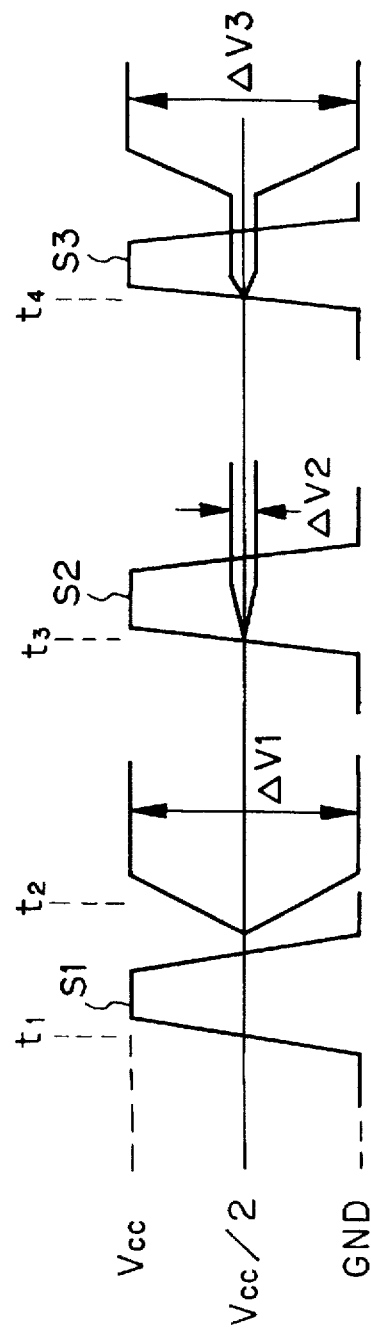
FIG. 13 is a timing diagram showing the operation of the apparatus of FIG. 12.
Figure 17A:
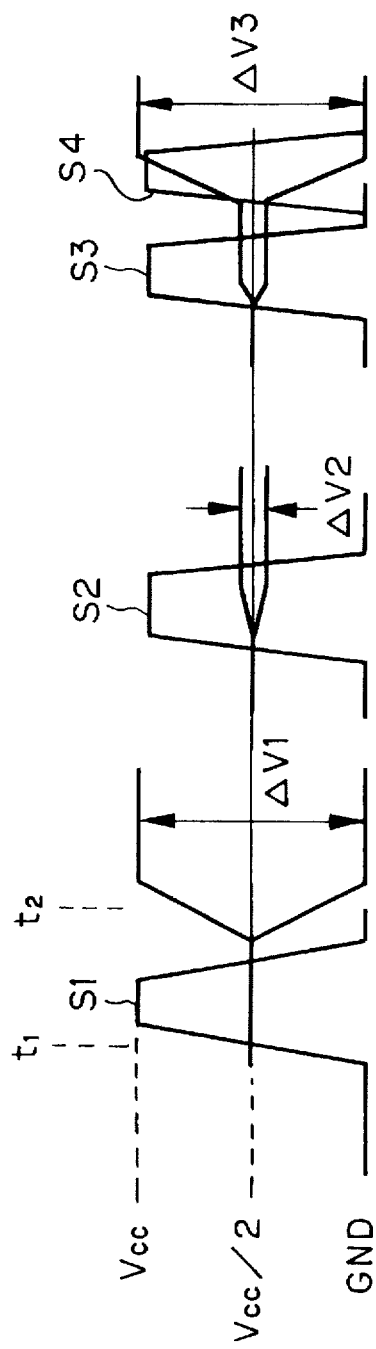
FIGS. 17A and 17B are timing diagrams showing the operation of the apparatus of FIG. 16.

A data transfer from the data output circuit 1' to the amplifier circuit 5' is shown in FIG. 17A which is the same as FIG. 13. That is, the sequence of the control signals generated from the control circuit 6 is S1→S2→S3→S4. In this case, the data output circuit 1' is activated, and the data output circuit 1" is deactivated.

Figure 17B:
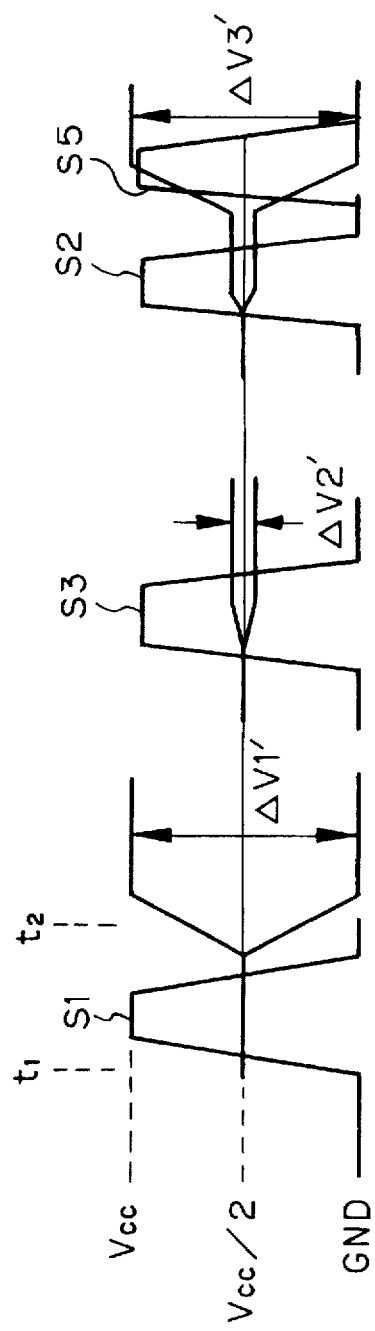

A data transfer from the output circuit 1" to the amplifier circuit 5" is shown in FIG. 17B. That is, the sequence of the control signals generated from the control circuit 6 is S1→S3→S2→S5. In this case, the data output circuit 1" is activated, and the data output circuit 1' is deactivated.

Figure 18A:
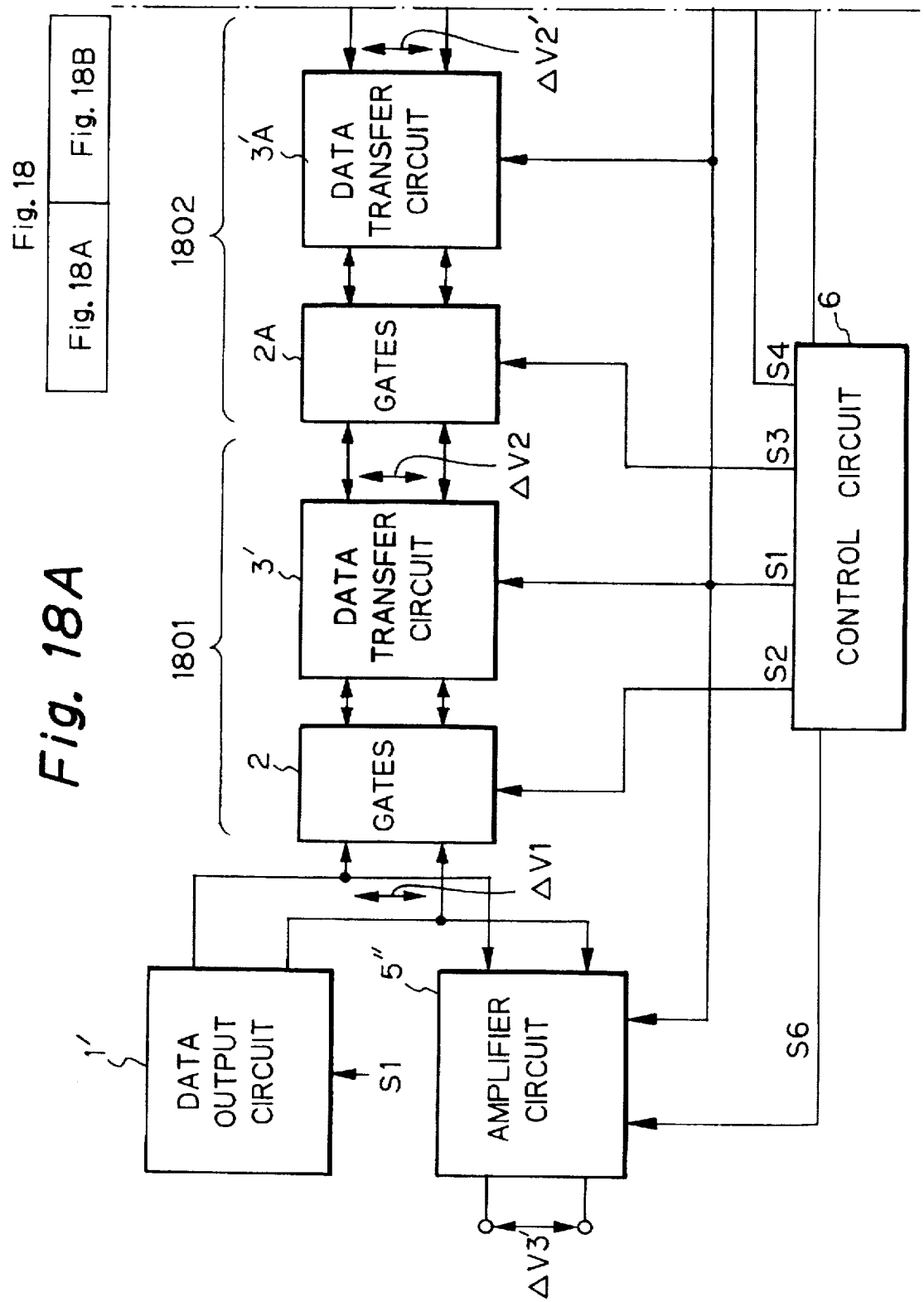

In FIGS. 18A and 18B, which illustrate a modification of the data transfer apparatus of FIG. 16, a transfer gate circuit 2A and a data transfer circuit 3'A indicated by 1802 having the same configuration as the transfer gate circuit 2 and the data transfer circuit 3' of FIG. 16 indicated by 1801 are added to the elements of FIG. 16. In this case, $$\Delta V2 > \Delta V2'$$

Also, three or more of series each comprising a transfer gate circuit and a data transfer circuit can be connected between the data output circuit 1' (the amplifier circuit 5") and the transfer gate circuit 4 of FIG. 16.

In FIGS. 18A and 18B, when a data transfer from the data output circuit 1' to the amplifier circuit 5' is carried out, the sequence of the control signals generated from the control circuit 6 is S1→S2→S3→S4→S5.

On the other hand, when a data transfer from the output circuit 1" to the amplifier circuit 5" is carried out, the sequence of the control signals generated from the control circuit 6 is S1→S4→S3→S2→S6.

Figure 19A:
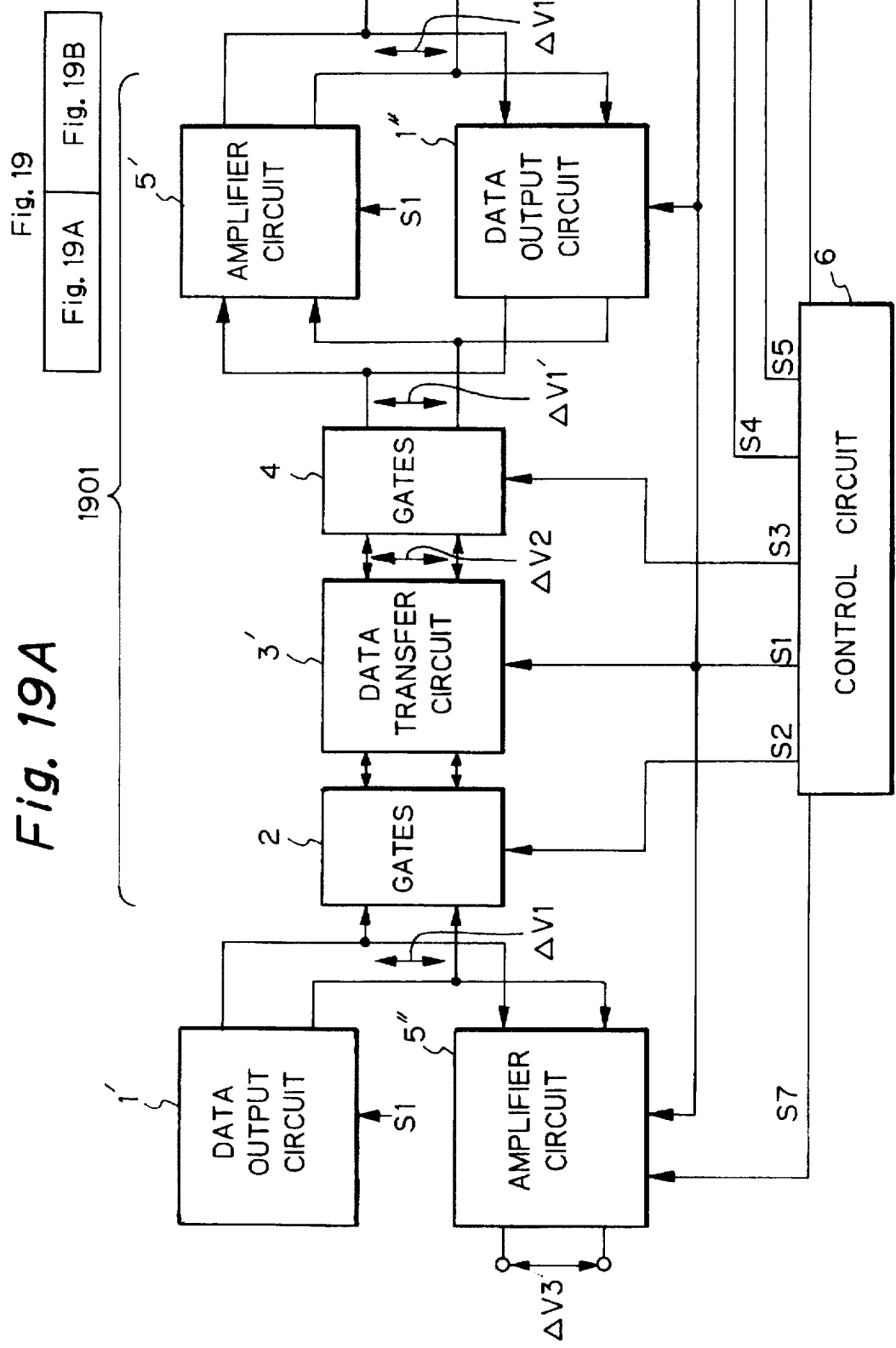
Figure 19B:
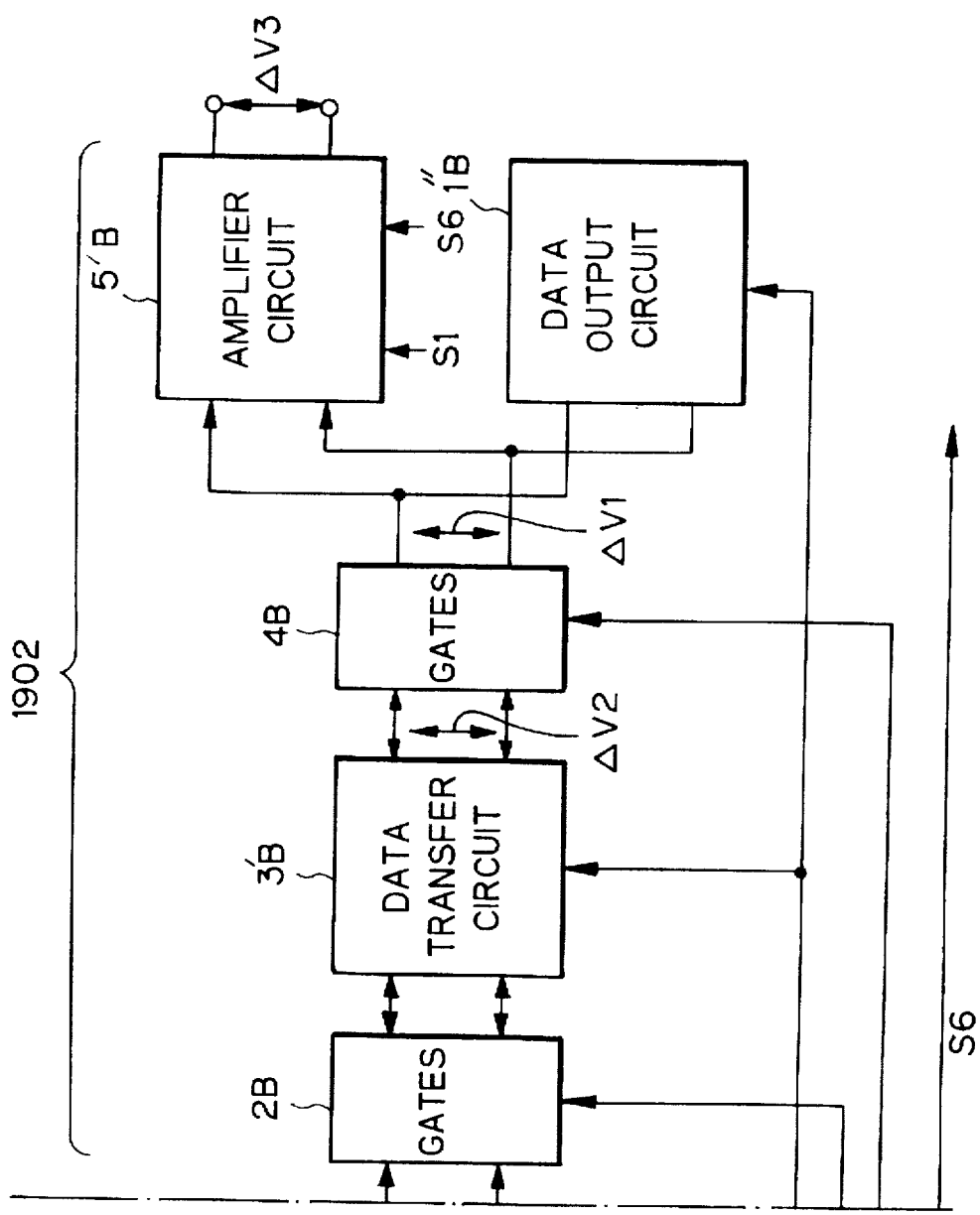

In FIGS. 19A and 19B, which illustrate another modification of the data transfer apparatus of FIG. 16, a transfer gate circuit 2B, a data transfer circuit 3'B, a transfer gate circuit 4B, an amplifier circuit 5'B and a data output circuit 1"B indicated by 1902 having the same configuration as the transfer gate circuit 2, the data transfer circuit 3', the transfer gate circuit 4, the amplifier circuit 5' and the data output circuit 1" of FIG. 16 indicated by 1901 are added to the elements of FIG. 16.

Also, three or more of series each comprising a transfer gate circuit, a data transfer circuit, a transfer gate circuit, an amplifier circuit and a data output circuit can be connected at a post stage of the amplifier circuit 5' and the data output circuit 1" of FIG. 16.

Figure 20:
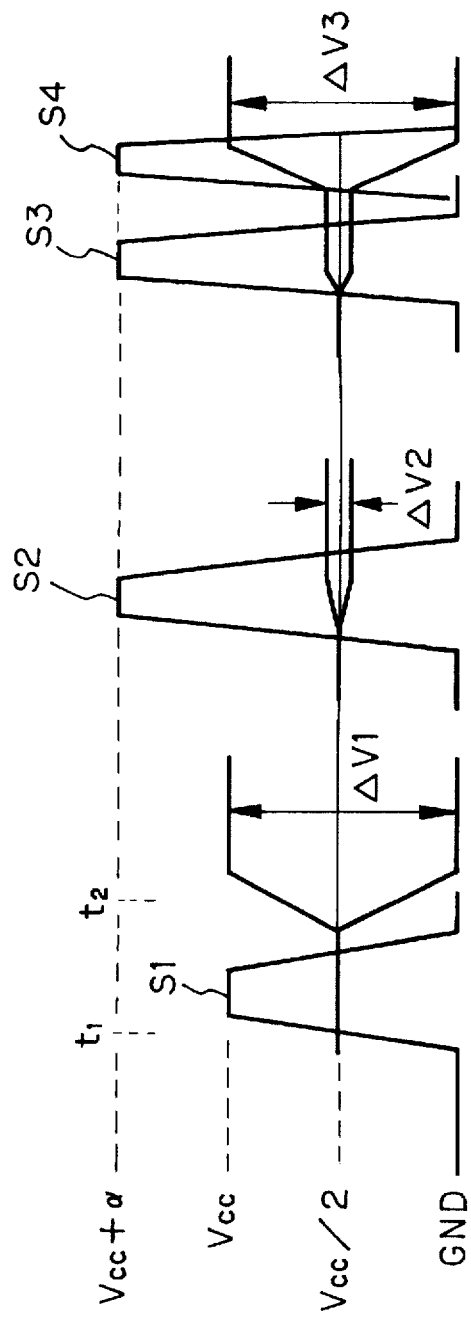
FIG. 20 is a timing diagram of a modification of the timing diagram of FIG. 13.

In the above-described first and second embodiments, the control signals S2, S3, S4 and S5 for controlling the transfer gate circuits are made $V_{CC}$. However, if the transfer gate circuits are formed by N-channel MOS transistors as illustrated in FIG. 7, the control signals S2, S3, S4 and S5 are made $V_{CC}+\alpha$, where $\alpha$ is larger than the threshold voltage of the N-channel MOS transistors, which effectively carries out a data transfer. In this case, the timing diagram of FIG. 13 is modified into FIG. 20.

Figure 21A:
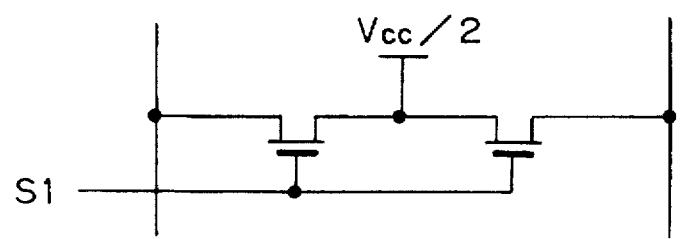
FIGS. 21A and 21B are circuit diagrams of the $V_{CC}$ precharging circuit, the equalizer circuit and the $V_{CC}$ precharging equalizer circuit of FIGS. 12 and 16.
Figure 21B:
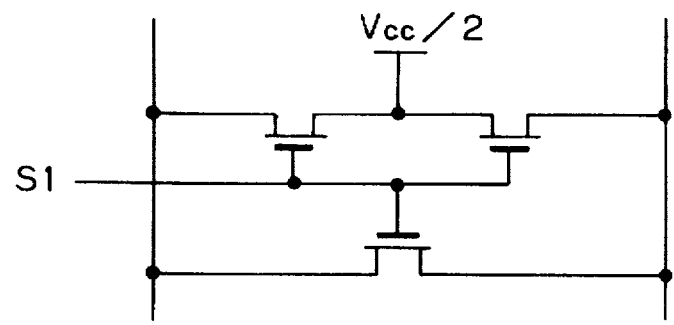

Also, in the above-described first and second embodiments, each of the data output circuit such as 1, the data transfer circuit such as 3' and the amplifier circuit 5' incorporates a $V_{CC}/2$ precharging circuit as illustrated in FIG. 21A; however, as illustrated in FIG. 21B, an equalizer circuit can be added to the $V_{CC}/2$ precharging circuit. Note that the equalizer circuit as illustrated in FIG. 21B is helpful in reducing the power dissipation.

Figure 22:
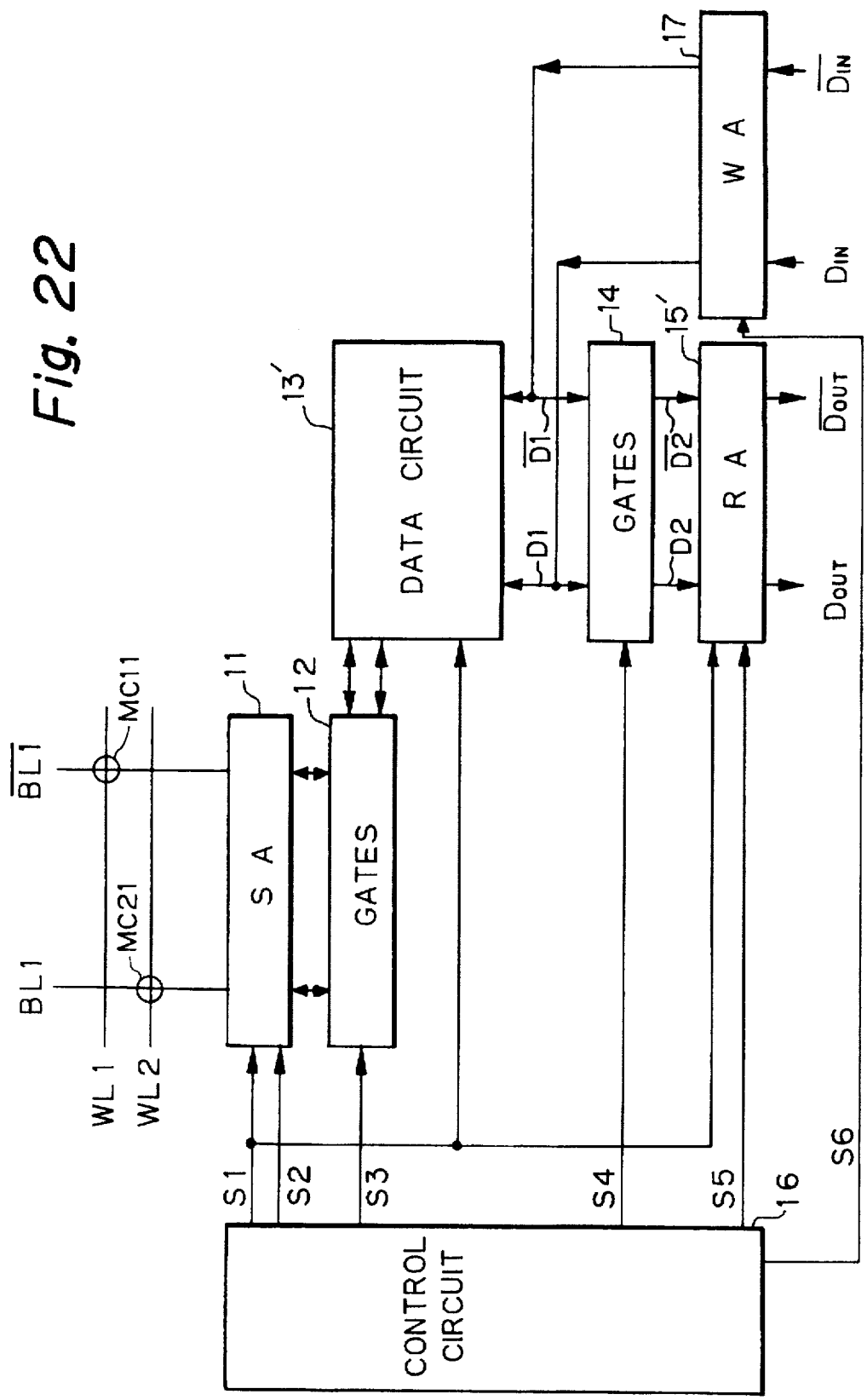
FIG. 22 is a block circuit diagram illustrating a third embodiment of the data transfer apparatus according to the present invention.

In FIG. 22, which illustrates a third embodiment of the present invention, the after embodiment apparatus of FIG. 12 is applied to a DRAM device. A data line circuit 13' and a read amplifier 15' are provided instead of the data line circuit 13 and the read amplifier 15, respectively, of FIG. 5.

Figure 23:
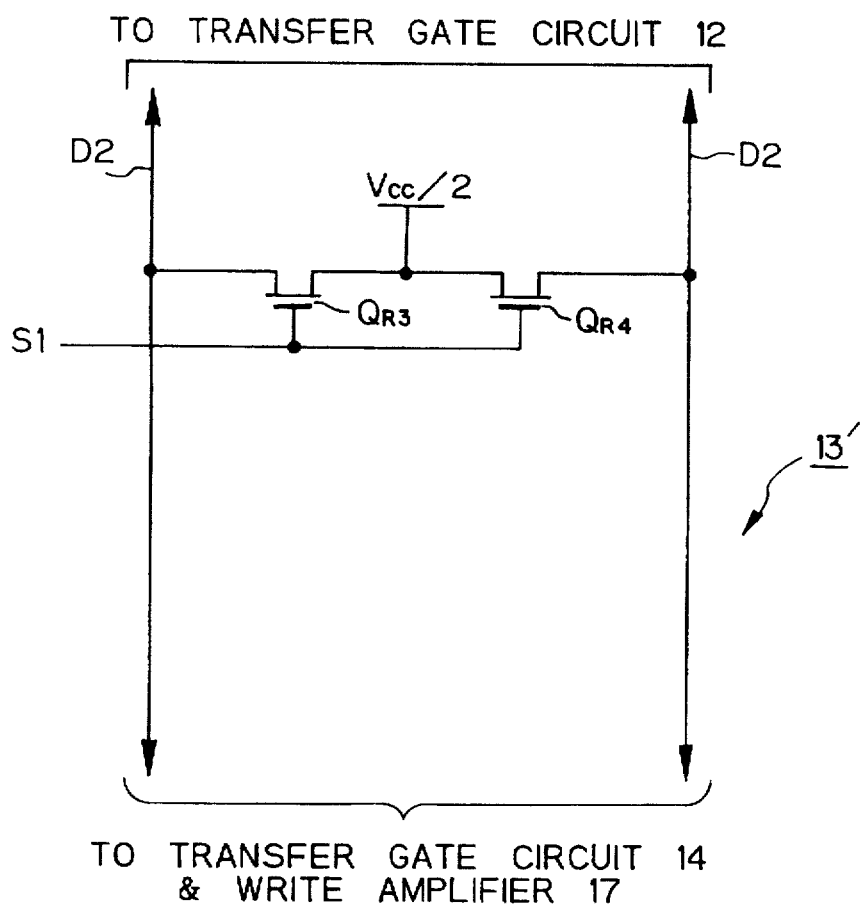
FIG. 23 is a detailed circuit diagram of the data line circuit of FIG. 22.
Figure 24:
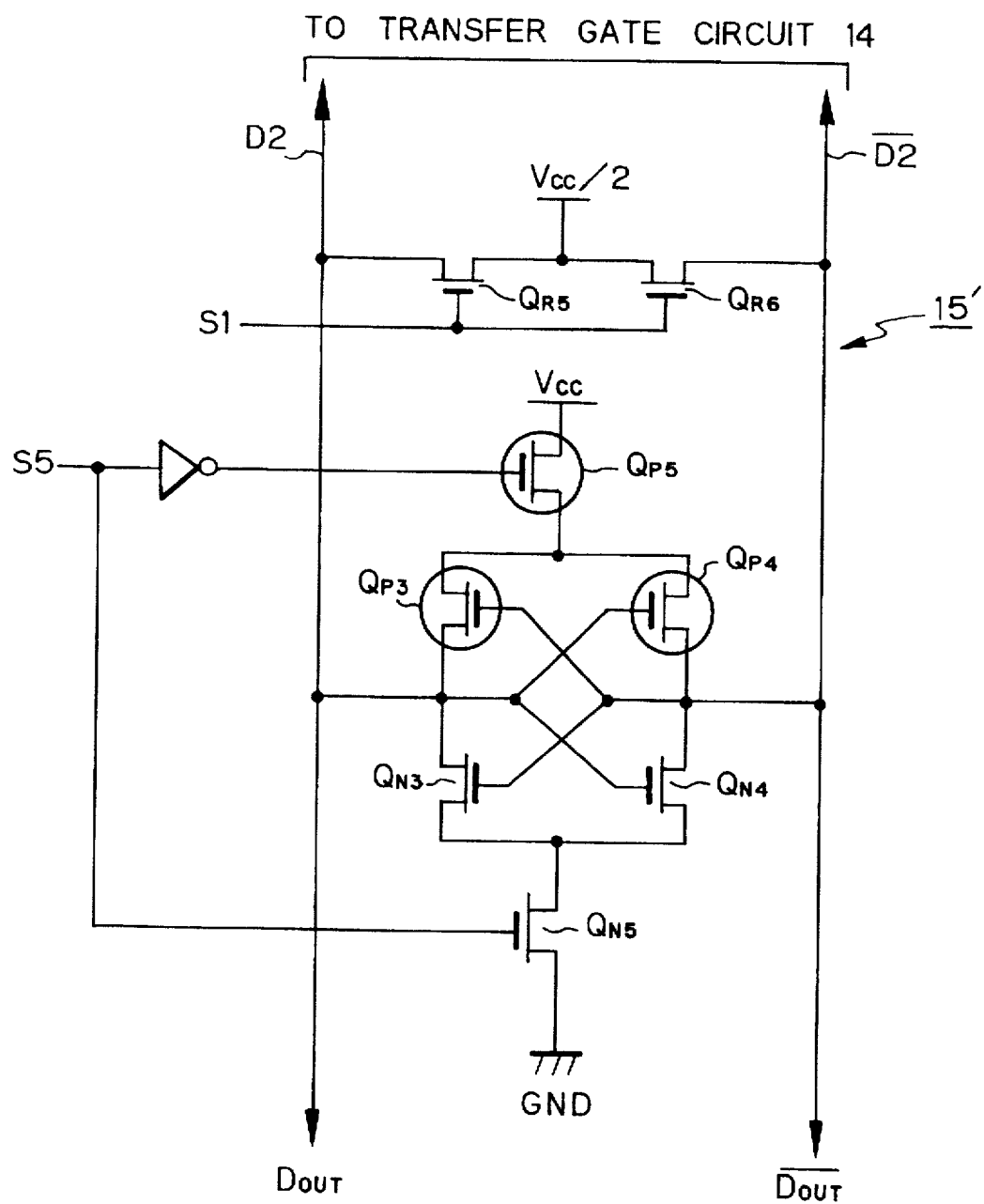
FIG. 24 is a detailed circuit diagram of the read amplifier of FIG. 22.

As illustrated in FIG. 23, the read amplifier 13' incorporates a $V_{CC}/2$ precharging circuit operated in response to the control signal S1. Also, as illustrated in FIG. 24, the data line circuit 15' incorporates a $V_{CC}/2$ precharging circuit operated in response to the control signal S1.

Figure 25A:
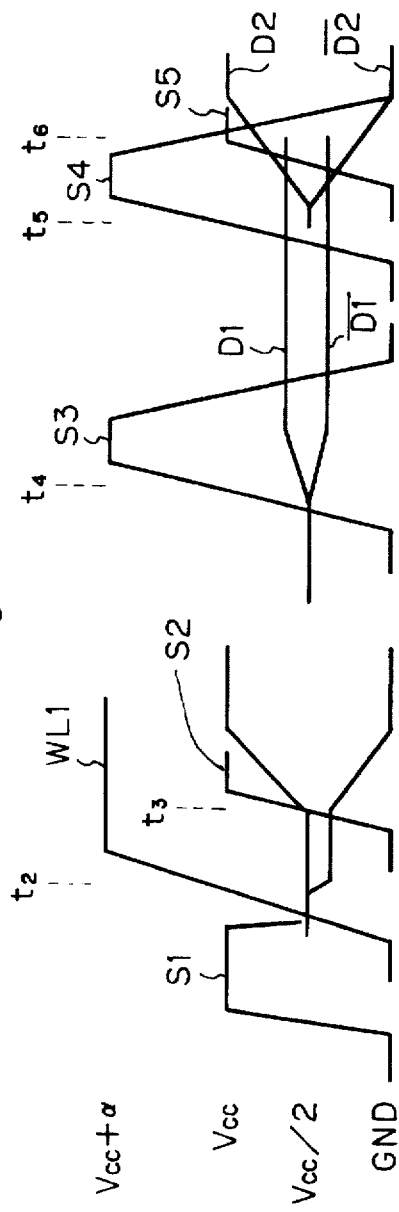
FIGS. 25A and 25B are timing diagrams showing the operation of the apparatus of FIG. 22.

A read operation of the data transfer apparatus of FIG. 22 is explained next with reference to FIG. 25A.

First, at time $t_1$, the control circuit 16 generates a control signal S1 and transmits it to the sense amplifier 11, the data line circuit 13' and the amplifier circuit 15'. As a result, the voltages of the bit lines BL1 and $\overline{BL1}$ are caused to be $V_{CC}/2$. Also, the voltages of the data lines D1 and $\overline{D1}$ and the voltages of the data lines D2 and $\overline{D2}$ are caused to be $V_{CC}/2$. Then, the control signal S1 is deactivated.

Next, at time $t_2$, one word line such as WL1 is selected and its voltage is caused to be $V_{CC}+\alpha$. As a result, a small difference in potential is generated between the bit lines BL1 and $\overline{BL1}$.

Next, at time $t_3$, the control circuit 16 generates a control signal S2 and transmits it to the sense amplifier 11, so that the sense amplifier 12 is activated. As a result, the voltage of one of the bit lines such as BL1 is caused to be $V_{CC}$, while the voltage of the other bit line $\overline{BL1}$ is caused to be GND.

Next, at time $t_4$, the control circuit 16 generates a control signal S3 and transmits it to the transfer gate circuit 12. As a result, the transfer gate circuit 12 is opened to pass the output signals of the sense amplifier 11 to the data line circuit 13'. Therefore, the amplitude of the voltages of the data lines D1 and $\overline{D1}$ is increased. In this case, the voltage of one of the data lines such as D1 is made a little higher, while the voltage of the other of the data lines such as $\overline{D1}$ is made a little lower. Then, the control signal S3 is deactivated.

Next, at time $t_5$, the control circuit 16 generates a control signal S4, and transmits it to the transfer gate circuit 14. As a result, the transfer gate circuit 14 is opened, so that the voltages of the data lines D2 and $\overline{D2}$ are close to those of the data lines D1 and $\overline{D1}$, respectively. Then, the control signal S4 is deactivated.

Finally, at time $t_6$, the control circuit 16 generates a control signal S5 and transmits it to the read amplifier 15', so that the read amplifier 15' is activated. As a result, the voltage of one of the data lines such as D2 is caused to $V_{CC}$, while the voltage of the other of the data lines such as $\overline{D2}$ is caused to be GND.

Figure 25B:
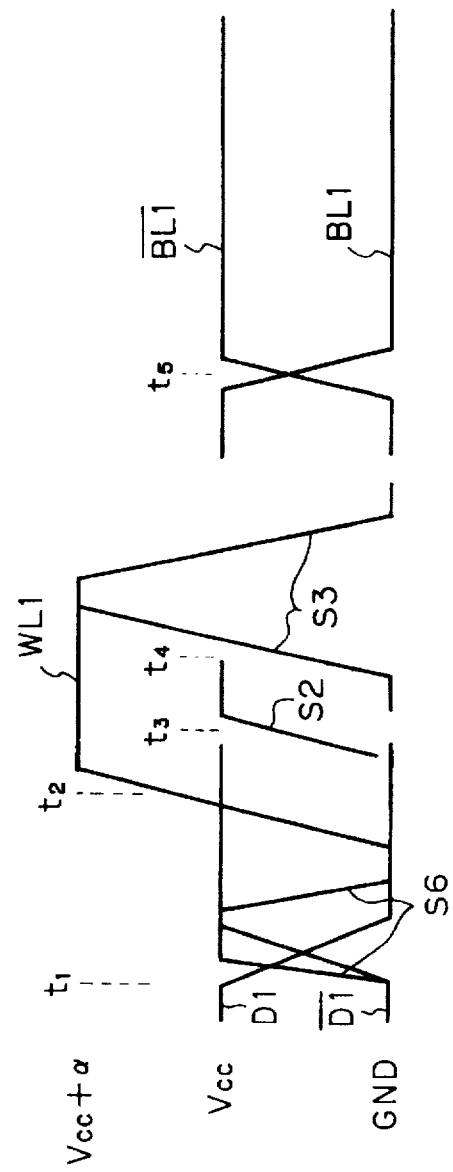

A write operation of the data transfer apparatus of FIG. 22 is explained next with reference to FIG. 25B.

First, at time $t_1$, the control circuit 16 generates a control signal S6 and transmits it to the write amplifier 17. As a result, the write amplifier 17 forcibly changes the voltages of the data lines D1 and $\overline{D1}$ in accordance with input data $D_{IN}$ and $\overline{D_{IN}}$. Then, the control signal S6 is deactivated.

Next, at time $t_2$, one of the word lines such as WL1 is selected and its voltage is caused to be $V_{CC}+\alpha$. Also, at time $t_3$, the control circuit 16 generates a control signal S2 and transmits it to the sense amplifier 11, so that the sense amplifier 11 is activated.

Next, at time $t_4$, the control circuit 16 generates a control signal S3 having a voltage of $V_{CC}+\alpha$ and transmits it to the transfer gate circuit 12. As a result, the transfer gate circuit 12 is opened. Then, the control signal S3 is deactivated.

When the transfer gate circuit 12 is opened, the voltages of the data lines D1 and $\overline{D1}$ determined by the write amplifier 17 forcibly change the voltages of the bit lines BL1 and $\overline{BL1}$ at time $t_5$. Thus, the content of the selected memorey cell is reversed.

In the data transfer apparatus of FIG. 22, since one of the data lines D1 and $\overline{D1}$ and one of the data lines D2 and $\overline{D2}$ are swung from the power supply voltage $V_{CC}/2$, they are not subject to the fluctuation of the power supply voltage $V_{CC}$ or the ground voltage GND, and thus, a noise margin is increased. Also, power dissipation is decreased due to a small charging and discharging amount.

Figure 26:
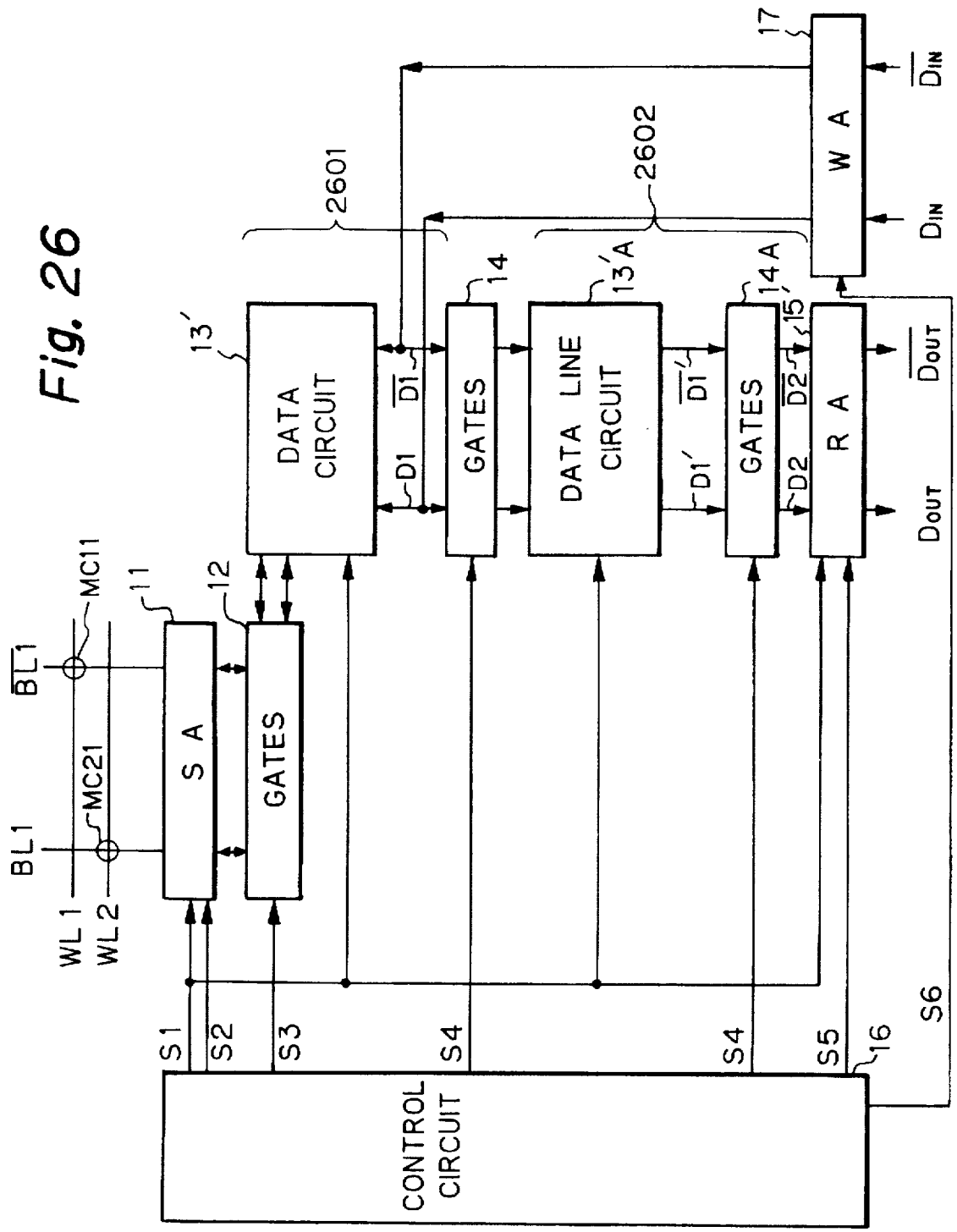

In FIG. 26, which illustrates a modification of the data transfer apparatus of FIG. 22, a data line circuit 13'A and a transfer gate circuit 14A indicated by 2602 having the same configuration as the data line circuit 13' and the transfer gate circuit 14 of FIG. 22 indicated by 2601 are added to the elements of FIG. 22.

Also, three or more of series each comprising a data line circuit and a transfer gate circuit can be connected between the data transfer circuit 12 and the data amplifer circuit 15' of FIG. 22.

Figure 27B:
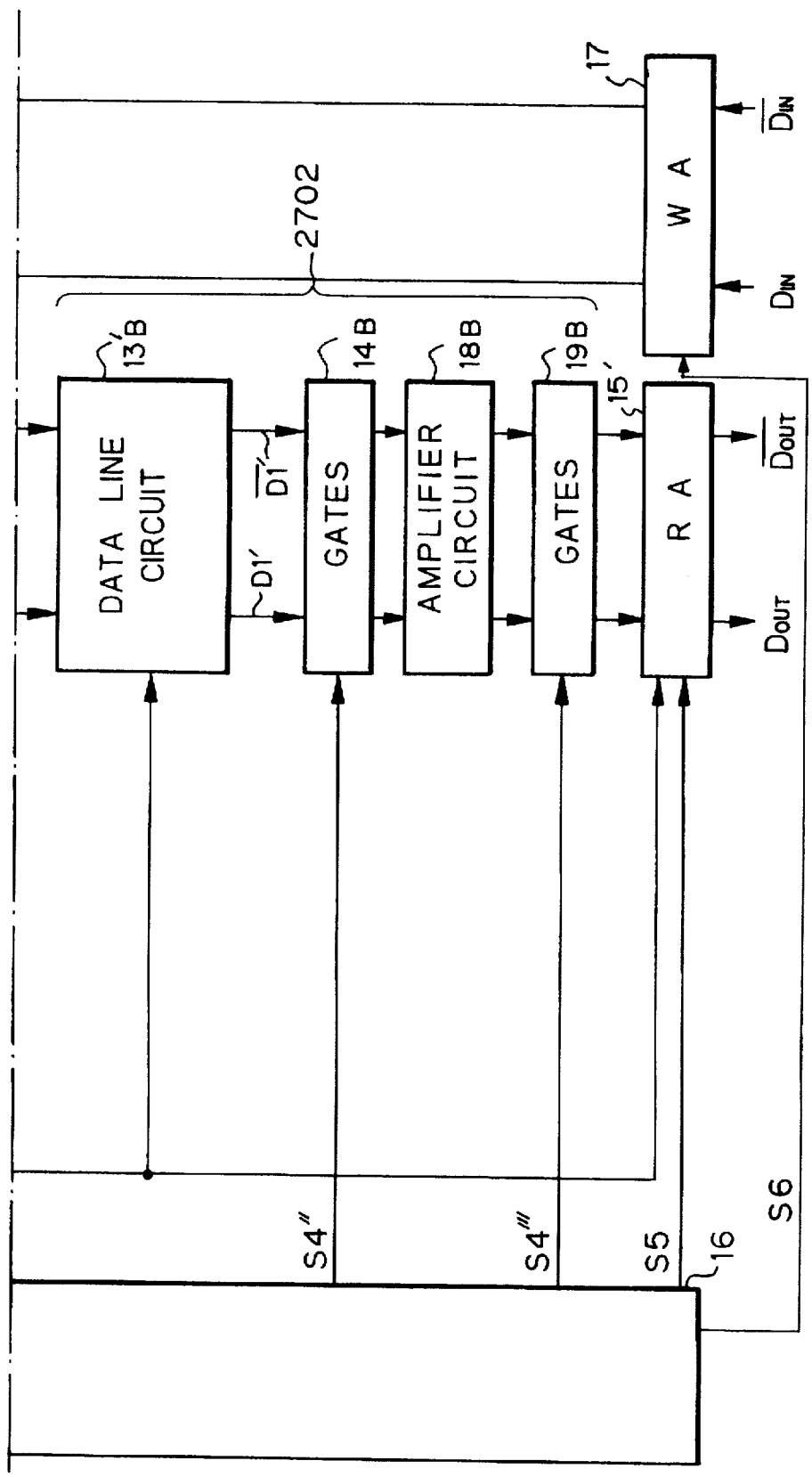

In FIGS. 27A and 27B, which illustrate another modification of the data transfer apparatus of FIG. 22, an amplifier circuit 18 and a transfer gate circuit 19 are connected to the transfer gate circuit 14 of FIG. 22. Also, a data line circuit 13'B, a transfer gate circuit 14B, an amplifier circuit 18B and a transfer gate circuit 19B indicated by 2702 having the same configuration as the data line circuit 13', the transfer gate circuit 14, the amplifier circuit 18 and the transfer gate circuit 19 indicated by 2701 are provided.

Also, three or more of series each comprising a data line circuit, a transfer gate circuit, an amplifier circuit and a transfer gate circuit can be connected at a post stage of the transfer gate circuit 12 of FIG. 22.

Figure 28:
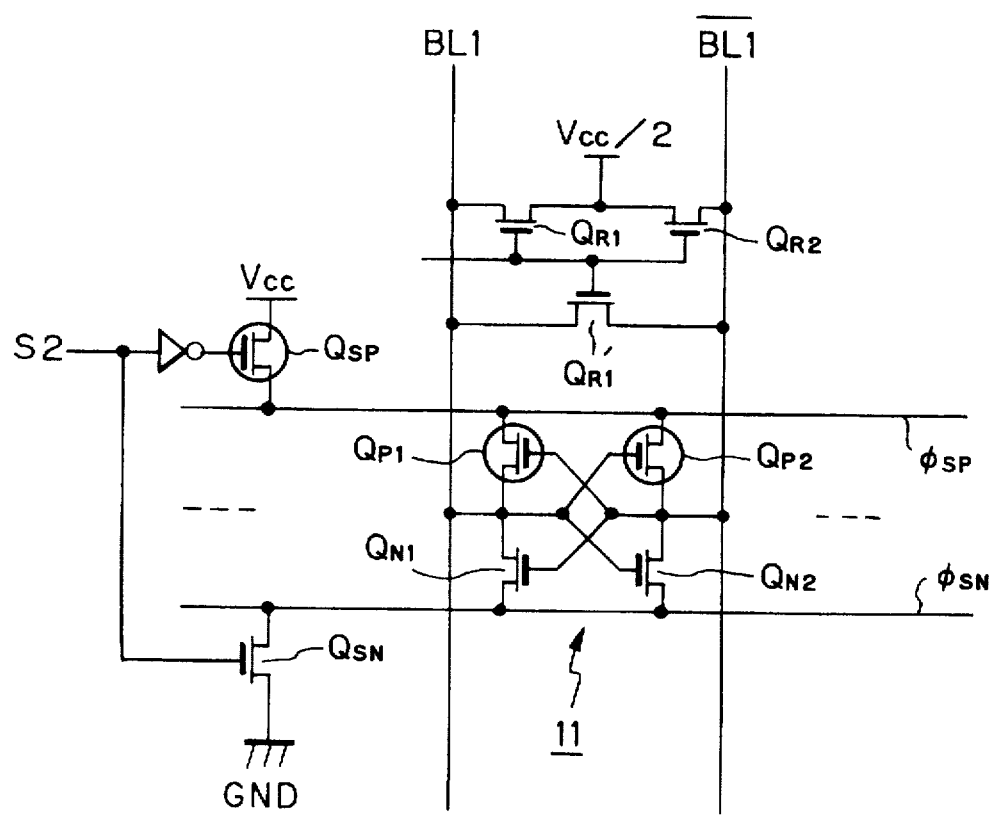
FIG. 28 is circuit diagrams of the sense amplifier of FIGS. 22, 26, 27A and 27B.
Figure 29:
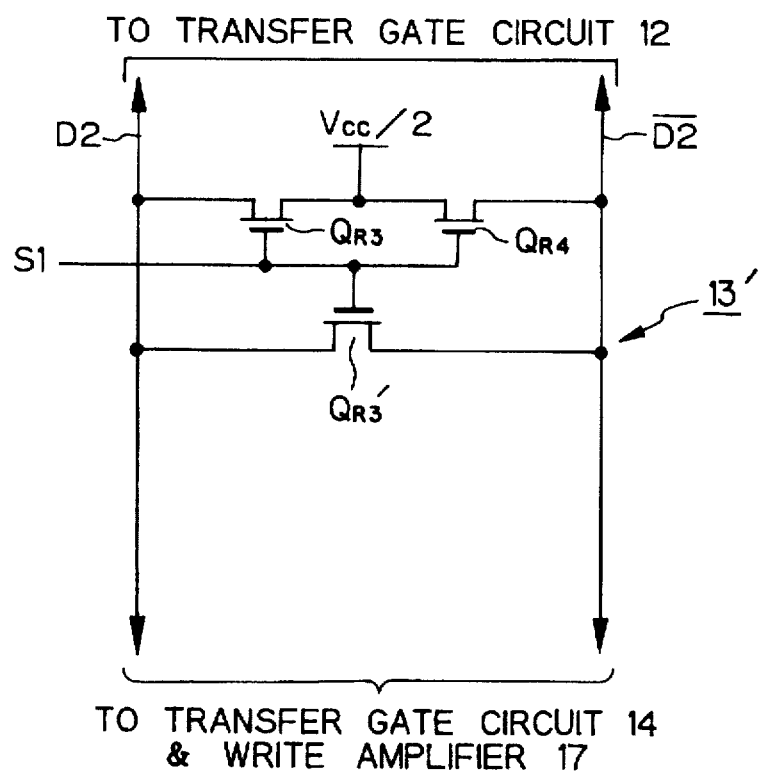
FIG. 29 is circuit diagrams of the data line circuit of FIGS. 22, 26, 27A and 27B.
Figure 30:
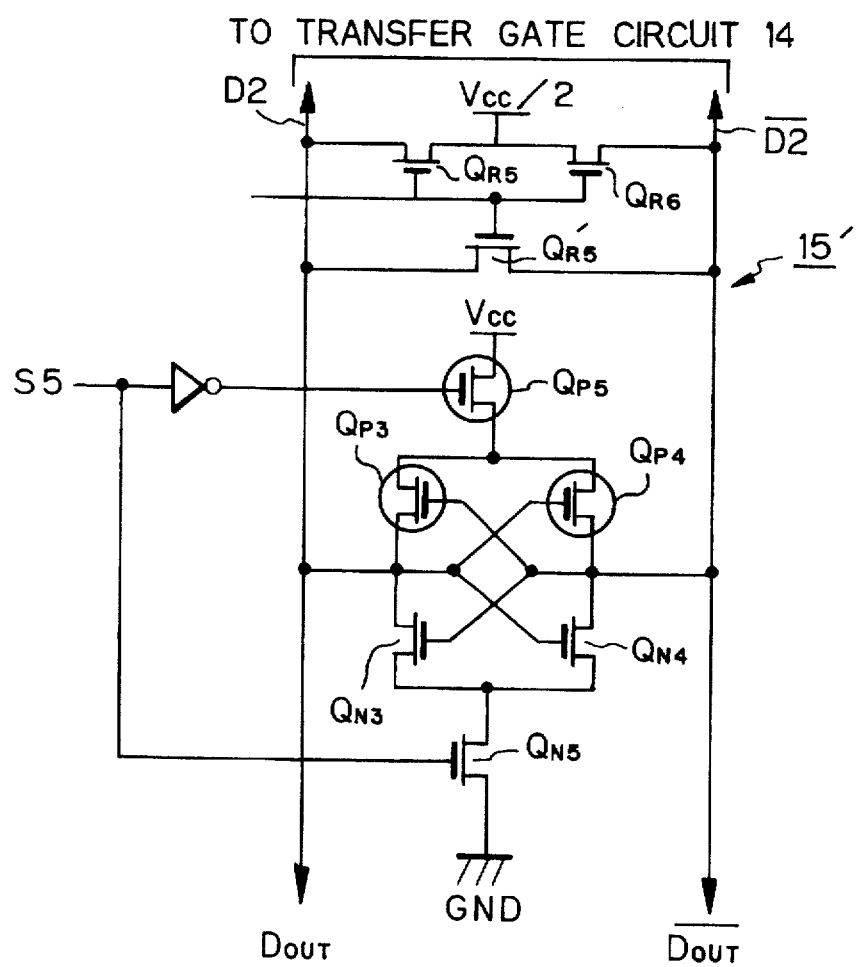
FIG. 30 is circuit diagrams of the read amplifier of FIGS. 22, 26, 27A and 27B.

Also, in the above-described third embodiment, each of the sense amplifier 11, the data line circuit such as 13', and the read amplifier circuit 15' incorporates a $V_{CC}/2$ precharging circuit; however, as illustrated in FIG. 28, 29 and 30, an equalizer circuit can be added to the $V_{CC}/2$ precharging circuit. Note that the equalizer circuit as illustrated in FIGS. 28, 29 and 30 is helpful in reducing the power dissipation.

As explained hereinabove, according to the present invention, since the voltages of the data lines are not subject to the fluctuation of the power supply voltage and the ground voltage, the noise margin can be increased. Also, the power dissipation can be reduced due to a small charging and discharging amount.

We claim:

1. A data transfer apparatus powered by a first power supply voltage and a second power supply voltage higher than said first power supply voltage, comprising:

a data output circuit for generating first complementary output signals;

a data transfer circuit having a large load capacitance for transferring said first complementary output signals to generate second complementary output signals;

an amplifier circuit for amplifying said second complementary output signals to generate third complementary output signals;

a first transfer gate circuit connected between said data output circuit and said data transfer circuit;

a second transfer gate circuit connected between said data transfer circuit and said amplifier circuit;

means for causing said first, second and third complementary output signals to be approximately at an intermediate level between said first and second voltages, said means comprising precharging circuits for precharging lines of said first, second and third complementary signals to said intermediate level, a first equalizer circuit for equalizing said first complementary output signals, a second equalizer circuit for equalizing said second complementary output signals, and a third equalizer circuit for equalizing said third complementary output signals; and a control circuit connected to said first and second transfer gate circuits and said means, said control circuit generating a first control signal for controlling said means, a second control signal for turning ON said first transfer gate circuit after generation of said first control signal, and a third control signal for turning ON said second transfer sate circuit after generation of said second control signal.

2. The apparatus as set forth in claim 1, wherein each of said data output circuit, said data transfer circuit and said amplifier circuit incorporates said means.

3. The apparatus as set forth in claim 1, wherein said first and second transfer gate circuits comprise N-channel MOS transistors, said N-channel MOS transistors being controlled by a voltage higher than said second voltage.

4. A data transfer apparatus powered by a first power supply voltage and a second power supply voltage higher than said first power supply voltage, comprising:

a data output circuit for generating first complementary output signals;

a data transfer circuit having a large load capacitance for transferring said first complementary output signals to generate second complementary output signals;

an amplifier circuit for amplifying said second complementary output signals to generate third complementary output signals;

a first transfer gate circuit connected between said data output circuit and said data transfer circuit;

a second transfer gate circuit connected between said data transfer circuit and said amplifier circuit;

means for causing said first, second and third complementary output signals to be approximately at an intermediate level between said first and second voltages; and at least one series circuit comprised of an additional transfer gate circuit and an additional data transfer circuit, said series circuit being connected between said data transfer circuit and said amplifier circuit, said additional data transfer circuit generating fourth complementary output signals, said means causing said fourth complementary output signals to be approximately at said intermediate level.

5. A data transfer apparatus powered by a first power supply voltage and a second power supply voltage higher than said first Power supply voltage, comprising:

a data output circuit for generating first complementary output signals;

a data transfer circuit having a large load capacitance for transferring said first complementary output signals to generate second complementary output signals;

an amplifier circuit for amplifying said second complementary output signals to generate third complementary output signals;

a first transfer gate circuit connected between said data output circuit and said data transfer circuit;

a second transfer gate circuit connected between said data transfer circuit and said amplifier circuit;

means for causing said first, second and third complementary output signals to be approximately at an intermediate level between said first and second voltages; and at least one series circuit comprised of a third transfer gate circuit, an additional data transfer circuit, a fourth transfer gate circuit and an additional amplifier circuit, said series circuit being connected to said amplifier circuit, said additional data transfer circuit generating fourth complementary output signals, said additional amplifier circuit generating fifth complementary output signals, said means causing said fourth and fifth complementary output signals to be approximately at said intermediate level.

6. A data transfer apparatus powered by a first power supply voltage and a second power supply voltage higher than said first power supply voltage, comprising:

a first input/output circuit including a first data output circuit for generating first complementary output signals and a first amplifier circuit for generating second complementary output signals;

a second input/output circuit including a second data output circuit for generating third complementary output signals and a second amplifier circuit for generating fourth complementary output signals;

a data transfer circuit having a large load capacitance for transferring said first complementary output signals to generate fifth complementary output signals and transferring said third complementary output signals to generate sixth complementary output signals;

a first transfer gate circuit connected between first input/output circuit and said data transfer circuit;

a second transfer gate circuit connected between said data transfer circuit and said second input/output circuit; and means for causing said first, second, third, fourth, fifth and sixth complementary output signals to be approximately at an intermediate level between said first and second voltages.

7. The apparatus as set forth in claim 6, wherein said means comprises precharging circuits for precharging lines of said first, second, third, fourth fifth and sixth complementary signals to said intermediate level.

8. The apparatus as set forth in claim 7, wherein said means comprises:

a first equalizer circuit for equalizing said first complementary output signals;

a second equalizer circuit for equalizing said second complementary output signals;

a third equalizer circuit for equalizing said third complementary output signals;

a fourth equalizer circuit for equalizing said fourth complementary output signals; and a fifth equalizer circuit for equalizing said fifth and sixth complementary output signals.

9. The apparatus as set forth in claim 6, wherein each of said first and second data output circuits, said data transfer circuit and said first and second amplifier circuits incorporates said means.

10. The apparatus as set forth in claim 6, further comprising a control circuit connected to said first and second transfer gate circuits and said means, said control circuit generating a first control signal for controlling said means, a second control signal for turning ON one of said first and second transfer gate circuits after generation of said first control signal, and a third control signal for turning ON the other of said first and second transfer gate circuits after generation of said second control signal.

11. The apparatus as set forth in claim 6, wherein said first and second transfer gate circuits comprise N-channel MOS transistors, said N-channel MOS transistors being controlled by a voltage higher than said second voltage.

12. The apparatus as set forth in claim 6, further comprising at least one series circuit comprised of an additional transfer gate circuit and an additional data transfer circuit said series circuit being connected between said data transfer circuit and said second input/output circuit, said additional data transfer circuit generating sixth and seventh complementary output signals, said means causing said fifth and sixth complementary output signals to be approximately at said intermediate level.

13. The apparatus as set forth in claim 6, further comprising at least one circuit comprised of a third transfer gate circuit, an additional data transfer circuit, a fourth transfer gate circuit and a third input/output circuit, said series circuit being connected said second input/output circuit, said additional data transfer circuit generating fifth and sixth complementary output signals, said third input/output circuit generating seventh and eighth complementary output signals, said means causing said fifth to eighth complementary output signals to be approximately at said intermediate level.

14. A dynamic semiconductor memory device powered by a first power supply voltage and a second power supply voltage higher than said first power supply voltage, comprising:

a plurality of bit line pairs;

a sense amplifier, connected to a selected one of said bit lines, for generating first complementary output signals;

a data line circuit having a large load capacitance for transferring said first complementary output signals to generate second complementary output signals;

a read amplifier circuit for amplifying said second complementary output signals to generate third complementary output signals;

a first transfer gate circuit connected between said sense amplifier and said data line circuit;

a second transfer gate circuit connected between said data line circuit and said read amplifier circuit;

means for causing said first, second and third complementary output signals to be approximately at an intermediate level between said first and second voltages, said means comprising precharging circuits for precharging lines of said first, second and third complementary signals to said intermediate level, a first equalizer circuit for equalizing said first complementary output signals, a second equalizer circuit for equalizing said second complementary output signals, and a third equalizer circuit for equalizing said third complementary output signals; and a control circuit connected to said first and second transfer gate circuits and said means, said control circuit generating a first control signal for controlling said means, a second control signal for activating said sense amplifier after generation of said first signal, a third control signal for turning ON said first transfer gate circuit after generation of said second control signal, a fourth control signal for turning ON said second transfer gate circuit after generation of said third control signal, and a fifth control signal for activating said read amplifier after generation of said fourth control signal.

15. The device as set forth in claim 14, wherein each of said sense amplifier, said data line circuit and said read amplifier incorporates said means.

16. The device as set in claim 14, further comprising a write amplifier connected to said data line circuit, said control circuit generating a seventh control signal for activating said sense amplifier and an eighth control signal for turning ON said first transfer gate circuit after generation of said seventh control signal.

17. The device as set forth in claim 14, wherein said first and second transfer gate circuits comprise N-channel MOS transistors, said N-channel MOS transistors being controlled by a voltage higher than said second voltage.

18. A dynamic semiconductor memory device powered by a first power supply voltage and a second power supply voltage higher than said first power supply voltage, comprising:

a plurality of bit line pairs;

a sense amplifier, connected to a selected one of said bit lines, for generating first complementary output signals;

a data line circuit having a large load capacitance for transferring said first complementary output signals to generate second complementary output signals;

a read amplifier circuit for amplifying said second complementary output signals to generate third complementary output signals:

a first transfer gate circuit connected between said sense amplifier and said data line circuit;

a second transfer gate circuit connected between said data line circuit and said read amplifier circuit;

means for causing said first, second and third complementary output signals to be approximately at an intermediate level between said first and second voltages; and at least one series circuit comprised of an additional data line circuit and a third transfer gate circuit said series circuit being connected between said second transfer gate circuit and said read amplifier circuit said additional data transfer circuit generating fourth complementary output signals, said means causing said fourth complementary output signals to be approximately at said intermediate level.

19. A dynamic semiconductor memory device powered by a first power supply voltage and a second power supply voltage higher than said first Power supply voltage, comprising:

a plurality of bit line pairs;

a sense amplifier, connected to a selected one of said bit lines, for generating first complementary output signals;

a data line circuit having a large load capacitance for transferring said first complementary output signals to generate second complementary output signals;

a read amplifier circuit for amplifying said second complementary output signals to generate third complementary output signals:

a first transfer gate circuit connected between said sense amplifier and said data line circuit;

a second transfer gate circuit connected between said data line circuit and said read amplifier circuit;

means for causing said first, second and third complementary output signals to be approximately at an intermediate level between said first and second voltages;

a first amplifier circuit connected to said second transfer gate circuit; and a third transfer gate circuit connected to said first amplifier circuit;

said device further comprising at least one series circuit comprised of an additional data line circuit, a fourth transfer gate circuit, a second amplifier circuit and a fifth transfer gate circuit, said series circuit being connected to said read amplifier circuit, said additional data line circuit generating fourth complementary output signals, said means causing said fourth complementary output signals to be approximately at said intermediate level.

* * * * *